(12) United States Patent  
Goss et al.

(10) Patent No.: US 8,248,856 B2  
(45) Date of Patent: Aug. 21, 2012

(54) PREDICTIVE READ CHANNEL CONFIGURATION

(75) Inventors: Ryan James Goss, Lakeville, MN (US); Kevin Gomez, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 190 days.

(21) Appl. No.: 12/908,295

(22) Filed: Oct. 20, 2010

(65) Prior Publication Data

US 2012/0102259 A1    Apr. 26, 2012

(51) Int. Cl.
*G11C 11/34* (2006.01)

(52) U.S. Cl. ............... 365/185.2; 365/210.11; 365/211; 365/238.5

(58) Field of Classification Search ............... 365/185.2, 365/210.11, 211, 238.5
See application file for complete search history.

(56) References Cited

U.S. PATENT DOCUMENTS

| | | | |
|---|---|---|---|
| 7,345,913 B2 * | 3/2008 | Isobe | 365/185.03 |
| 7,653,779 B1 | 1/2010 | Fein et al. | |
| 7,796,424 B2 * | 9/2010 | Happ et al. | 365/163 |
| 2006/0028875 A1 | 2/2006 | Avraham et al. | |
| 2008/0270730 A1 | 10/2008 | Lasser et al. | |
| 2010/0020604 A1 | 1/2010 | Cornwell et al. | |
| 2010/0131697 A1 | 5/2010 | Alrod et al. | |

* cited by examiner

*Primary Examiner* — Son Dinh
(74) *Attorney, Agent, or Firm* — Hollingsworth Davis, LLC

(57) ABSTRACT

The read channel of a solid state non-volatile memory may be configured to compensate for shifts in the threshold voltages of memory cells of the memory. A log of write time information and write temperature information from one or more write operations is stored in a data unit header. The read channel configuration, which may include reference voltages used for the read operation, is determined using the write time information and the write temperature information. Memory cells of the data unit are read using the configured read channel. A historical profile spanning multiple write operations may also be developed and used to configure the read channel.

20 Claims, 20 Drawing Sheets

PREDICTIVE READ CHANNEL CONFIGURATION

SUMMARY

Various embodiments described in this disclosure are generally directed to methods and devices for configuring the read channel of a solid state non-volatile memory to compensate for shifts in the threshold voltages of memory cells of the memory. According to some methods, write time information and write temperature information of one or more write operations are stored. The write time and temperature are later used to determine configuration information for the read channel. In some cases, the configuration information includes read operation reference voltages. An output that includes the read channel configuration information is sent to the memory for use in the read operation.

In some cases, the write time and temperature information from a write operation is stored in a data unit header within the data unit. The data unit header may be updated with write time information and write temperature information from one or more additional write operations.

In some cases, the data unit header is updated only if one or both of a write time and a write temperature of an additional write operation is beyond a predetermined value. In some cases, the update process used in updating the data unit header is modified to increase or decrease an amount of information stored in the data unit header by the updating. The modification to the update process may be triggered in response to diminished storage capacity of the data unit header. In some cases, the information previously stored in the data unit header may be reconfigured. For example, the reconfiguration may include one or more of compressing, deleting, and combining the information previously stored in the data unit header.

In some cases, the data unit comprises a garbage collection unit and the write operation is performed during garbage collection.

The reference voltages determined using the write time information and the write temperature information may compensate for one or both of charge leakage and disturb effects when used during the read operation.

Some methods may include developing a historical profile spanning the multiple write operations. The historical profile can include at least the number of erase/write cycles experienced by the data unit and temperature information that spans the multiple write operations of the data unit. The historical profile is stored, e.g., in the data unit header or in another storage location. Read channel configuration information is determined using the historical profile. In some cases, the configuration information includes reference voltages to be used for a read operation of the memory cells of the data unit. In some cases, the configuration information may include an estimation of the extent to which charge leakage and/or disturb effects have altered the threshold voltages of the memory cells. The estimation can be based on a charge loss/gain model of the memory cells. An output that includes the configuration information is sent to the memory.

The temperature information can include one or both of an operating temperature of the data unit and a number of write operations within a temperature range. In some cases, a log of a current write operation may be stored, the log including one or both of write time information of the current write operation and write temperature information of the current write operation. In these cases, determining the reference voltages may include determining the reference voltages using the write time information and the write temperature information of the current write operation in addition to the historical profile.

A memory device may comprise a write operation control module configured to control write operations of a memory. The write operations cause data to be stored in pages of memory cells of a data unit of the memory. Information acquisition circuitry controls the acquisition and storage of write time information and write temperature information for at least some of the write operations. Read channel configuration circuitry determines configuration information, e.g., including one or more reference voltages to be used for read operations performed on the pages of the data unit. The reference voltages are determined using the write time information and the write temperature information. The read channel configuration circuitry is further configured to output the configuration information to the read channel detector circuitry of the memory. In some cases, the information acquisition circuitry may also acquire an operating temperature of the data unit. In these cases, the read channel configuration circuitry determines the reference voltages also using the operating temperature.

The read channel configuration circuitry may determine adjusted the reference voltages to compensate for expected shifts in threshold voltages of the memory cells due to charge leakage, e.g., according to a charge loss/gain model of the data unit.

The information acquisition circuitry may be configured to control storage of the write time information and the write temperature information in a data unit header within the data unit. In some cases, the data unit is a garbage collection unit and the write time information comprises a sequence number of the garbage collection unit.

In some cases, the information acquisition circuitry develops a historical profile that spans multiple write operations based on write time information and write temperature information from each of the multiple write operations. For example, the historical profile may include a number of erase/write cycles experienced by the data unit and/or a number of write operations performed within a temperature range and/or below a predetermined temperature. The information acquisition circuitry can adapt a process for storing the write time information and the write temperature information in response to reduced storage capacity for the write time information and the write temperature information. The information acquisition circuitry may also adapt the process for storing the write time information and the write temperature information in response to a need for increased information about the write time information and/or the write temperature information.

These and other features can be understood in view of the following detailed discussion and the accompanying drawings.

DETAILED DESCRIPTION

Figure 1A:
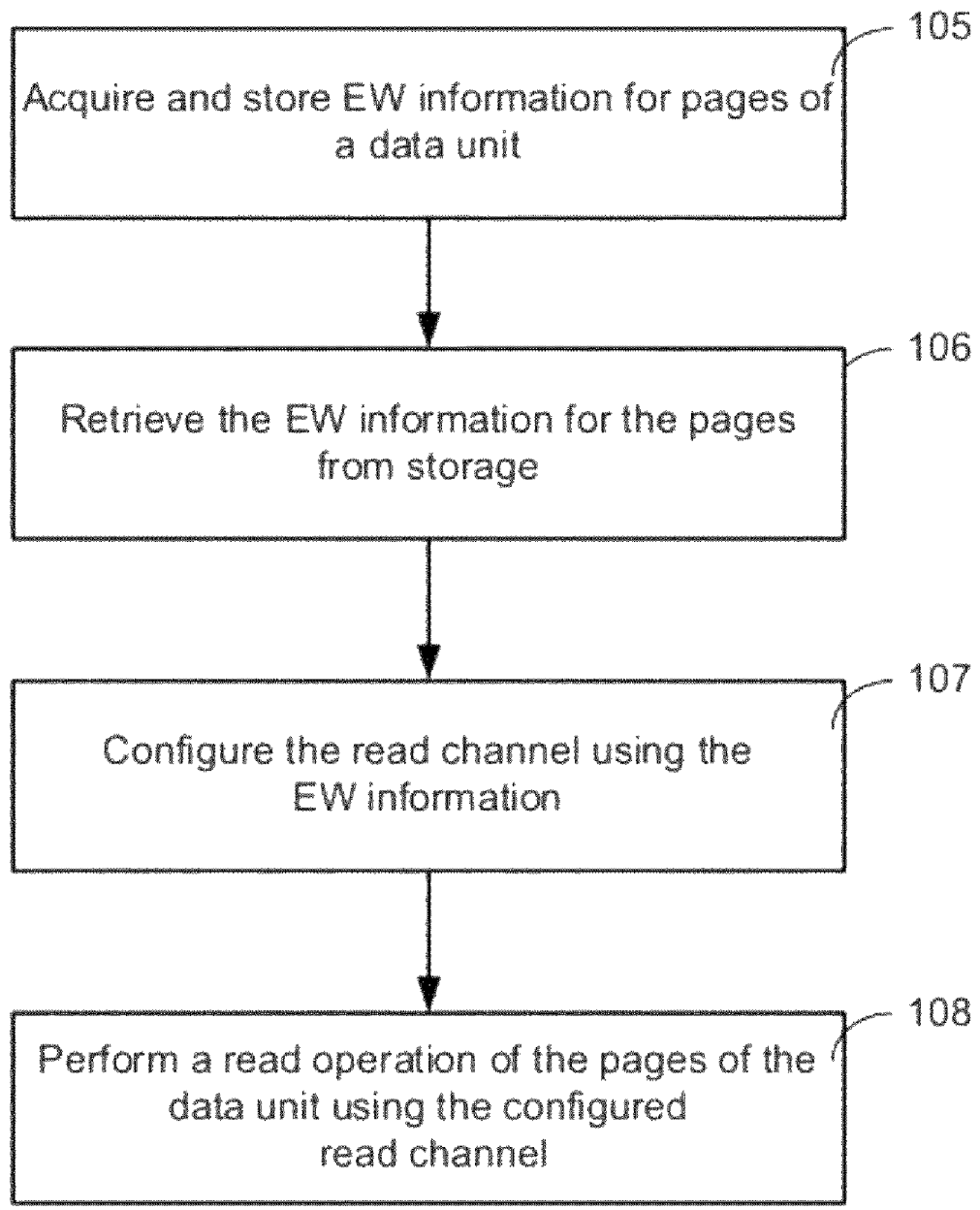
FIG. 1A is a flow diagram that illustrates a process of configuring the read channel using read/write parameters acquired from least one previous write operation.

Non-volatile solid state memory devices are capable of retaining stored data in the absence of external power. Data may be stored in a transistor memory cell as charge on the floating gate of the transistor. The data can be later read by sensing the analog threshold voltage of the transistor. However, the charge stored on the floating gate is subject to charge leakage over time (retention effects), and to charge disturbances caused by local electrical signals (disturb effects). Either of these phenomena can change the threshold voltage of the transistor memory cell and cause errors in the data.

Charge stored in a memory cell may need to be retained for months or even years, e.g., longer than 10 years, even in the absence of power. Even a low charge leakage rate from the memory cell can cause data errors to occur after a long retention time. Disturb effects occur when the charge stored on the floating gate of a transistor memory cell is disturbed unintentionally by local electrical signals present when other memory cells are erased, written to (programmed), and/or read. These phenomena are respectively referred to herein as erase disturb, write disturb, and read disturb, respectively, and are referred to collectively as disturb effects. Disturb effects are dependent on the way the memory cells are connected and arise because electrical signals used to read, program, and/or erase memory cells are applied to some extent to other memory cells in the circuit that are not being read, written, or erased.

Retention effects and disturb effects are exacerbated by memory cell degradation. Memory cells degrade due to gate oxide breakdown which can be related to the erase/write cycle experience of the memory cells. The temperature at which the memory cells are written also affects gate oxide breakdown. Write operations at lower temperatures, e.g., below about 0 degrees C. or below than about 20 degrees C., for example, are more destructive than write operations at higher temperatures. The operating temperature of the device can also influence memory cell leakage because higher operating temperatures can accelerate charge leakage.

Some data errors, such as those caused by charge leakage and/or disturb effects, can be recovered by encoding the data using an error correction code (ECC). Alternatively or additionally, it can be beneficial to avoid data errors by compensating for charge leakage and disturb effects. For example, some embodiments described herein involve methods and systems that increase data reliability in solid state memory systems by compensating for charge leakage over time and/or by compensating for unintentional changes in the charge stored in memory cells due to read, write, and/or erase disturb effects. Some cases involve acquiring information related to phenomena such as charge leakage and/or disturb effects and using the information to configure the read channel to compensate for these phenomena. The read channel as discussed herein is considered to encompass the circuitry from the memory cell to the decoder.

The information used to compensate for charge retention effects may include, for example, the time since data was last written to the memory cells, the temperature of the most recent write operation of the memory cells, the temperatures of previous write operations of the memory cells, the number of erase/write operations experienced by the memory cells, and/or the operating temperature of the memory cells, and/or other information.

The information used to compensate for erase, write, and read disturb effects includes the information about the effect of cross coupling between neighboring memory cells during erase, write, and read operations. The information may include an expected amount of disturbance in the charge stored in the memory cell being read that is attributable to a neighboring memory cell being erased, written and/or read, and the times of previous erase, write, and read operations of neighboring memory cells. During a subsequent read operation, the system determines whether an erase, write, and/or read operation of a neighboring memory cell occurred since the data was written to the memory cell being read. If an erase, write, or read operation occurred that is likely to disturb the charge stored on the floating gate of the memory cell being read, then the reference voltage may be adjusted to compensate for the expected change in the threshold voltage of the memory cell. The effect of cross coupling between neighboring memory cells, e.g., the amount of charge disturbance during erase, write, and/or read operations, can be determined by testing the cross coupling effect on the memory cell, or can be estimated. Testing the cross coupling effect can include writing data to a test memory cell, performing an erase, write, and/or read operation on a neighboring memory cell and determining a shift in the threshold voltage of the test cell. Additional information that can be used to configure the read channel may also be acquired and stored, including previously successful channel settings such as the number and/or level of previously used read reference voltages, and/or the bit error rate of the memory cells.

The memory cell pages of a memory device are grouped into units referred to herein as data units. A data unit can correspond to a group of pages that is erased at substantially the same time, such as the erasure unit of a garbage collection operation. Between erasure times, the pages of the data unit are written to (programmed). In some circumstances, the pages of a data unit may all be written to at substantially the same time, e.g., within a few seconds or minutes of each other. In other circumstances, the pages of the data unit may be written to in groups over a longer period of time, e.g., hours, days, weeks, months. Regardless of whether the memory cells of the data unit are written to at substantially the same time, or in page groups over a longer time interval, the cycle of erasing the data unit and subsequently writing to the data unit is referred to herein as an erase/write cycle. Each erase/write cycle of the data unit includes at least one erase operation of the data unit and one or more write operations of the data unit depending on whether the data unit pages are written all at once or in groups.

Compensation for perturbations in the stored charge, including retention effects and disturb effects may be implemented by adjusting read channel parameters of a data unit based on erase/write cycle (E/W) information for the data unit. The E/W information may include a log of write operation parameters for the current erase/write cycle, such as information about the write time, e.g., a timestamp or sequence number for each write operation of the erase/write cycle, and/or information about the temperature of each write operation of the current erase/write cycle. The E/W information may also include a historical profile of the data unit that spans multiple erase/write cycles. For example, the historical profile of the data unit may include the number of erase/write cycles experienced by the data unit, the number of previous write operations experienced by the data unit, and/or the write temperature of the previous write operations. In some cases, the E/W information may include a historical profile that pertains to the data unit as a whole. In some cases, the E/W information may store unique profiles for each of multiple groups of pages within the data unit. The E/W information for each data unit is stored in E/W information storage, which may include data unit headers located within each data unit and/or storage in other locations of the memory device.

FIG. 1A illustrates a process of configuring the read channel using E/W information acquired from least one previous write operation. Write time information, write temperature information and/or other write operation information for pages of a data unit are acquired 105. For example, the write time information may comprise a time stamp or sequence number from which the write time of the write operation can be determined. The write temperature of the write operation can be determined from the write temperature information. Before a read operation is initiated, E/W information is retrieved 106. The read channel is configured 107 using the E/W information. In some cases, the read channel is configured by adjusting one or more reference voltages used to read the data from the memory cells. The reference voltages are output to the memory device for use during a read operation. The read operation is performed 108 on the pages of the data unit using the configured read channel.

Figure 1B:
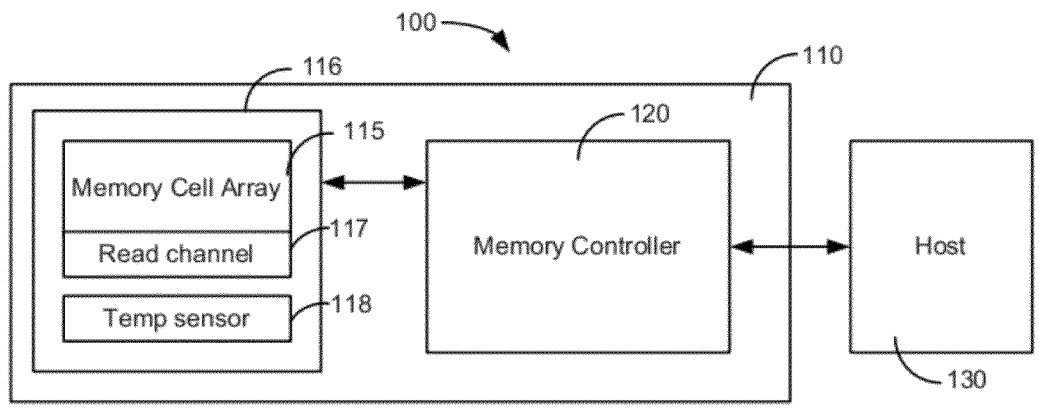
FIG. 1B is a block diagram illustrating a memory system capable of implementing reuse of information from memory read operations.

FIG. 1B is a block diagram of a system 100 capable of storing data for later retrieval via a read channel that can be configured according to the approaches described herein. The system 100 includes a memory device 110 and a host processor 130. The memory device 110 includes a memory 116 comprising array of memory cells 115 and a memory controller 120 that provides an interface between the memory 116 and the host 130, which may be any type of computing system. The block diagram of FIG. 1B and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, in some implementations, all or a portion of the functionality of the memory controller 120 may be included within the host 130. The various approaches described herein may be implemented using hardware, software, or a combination of hardware and software, for example.

The memory array 115 includes a number of memory cells, each memory cell capable of storing one or more bits of data. The memory system 100 includes a timer 119 which may be a component of the controller 120 (see FIG. 1C) that is capable of timing operations performed on the memory cells and a temperature sensor 118 that is capable of sensing the temperature of the memory array. Each data unit may include a header section reserved to store E/W information of the data unit, including, for example, a write operation log for the current erase/write cycle and/or a historical profile of write operations spanning multiple erase/write cycles.

The data stored in each memory cell of the memory array 115 is represented as an analog voltage according to the amount of charge stored in the memory cell. As discussed in more detail below, the analog voltages of each memory cell can be converted to a digital format corresponding to the one or more data bits stored in the memory cell. The conversion of data stored in a memory cell to digital format involves, for example, sensing the analog voltage of the memory cell and comparing the analog voltage to one or more reference voltages. The memory 116 includes read channel detector circuitry 117 that includes voltage sense and comparator circuitry configured to sense the analog voltages of the memory cells of the memory cell array 115. The detector circuitry may be configured to compare the sensed threshold voltages of the memory cells to reference voltages and to output an indication of the digital symbols stored in the memory cells based on the comparisons.

Figure 1C:
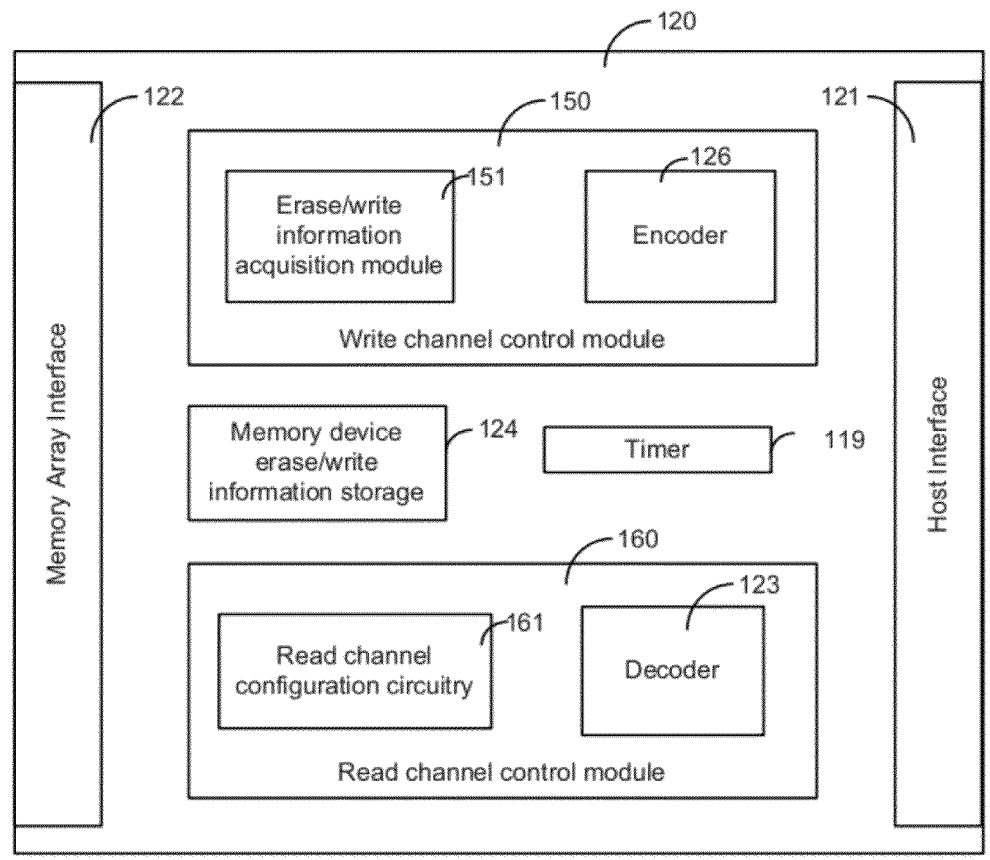
FIG. 1C is a block diagram that illustrates the memory controller of FIG. 1B in more detail.

FIG. 1C illustrates the memory controller 120 in more detail. A host interface 121 facilitates the transfer of data and control signals between the memory controller 120 and the host 130. A write channel control module 150 controls write operations. Write operations can involve transfer of data from the host 130 through the memory controller 120 and then to the memory array 115 for storage. Prior to storage of the data in the memory array 115, the data may be encoded by the encoder circuitry 126 using an error correcting code (ECC). The encoded data is then transferred via the memory array interface 122 from the controller 120 to the memory array 115 and is written in the memory cells of the memory array 115. An E/W information acquisition module 151 is configured to acquire information related to the write operation, such as the write time information and write temperature information.

When the host 130 requests the stored data from the memory array 115, the encoded data is read from the memory array 115 and is decoded by decoder circuitry 123 using the ECC. The decoded data is transferred to the host 130 via the host interface 121. The decoder 123 uses the ECC to attempt to correct errors that are present in the data read from the memory array 115. The data errors may arise, for example, due to noise present during the read operation and/or the write operation and/or due to data corruption caused by charge leakage and/or disturb effects as mentioned above. A read channel control module 160 controls read operations. The read channel control module 160 includes read channel configuration circuitry 161 capable of configuring the read channel. For example, the read channel configuration circuitry may determine a read channel configuration that compensates for retention and disturb effects using the E/W information acquired by the E/W information module. In some cases, configuration of the read channel by the read channel configuration circuitry can involve determining one or more reference voltages for use during the read operation that compensate for expected charge leakage effects and/or disturb effects. During the read operation, the sensed threshold voltages of the memory cells are compared to the reference voltages that compensate for charge leakage and/or disturb effects.

In some cases, the read channel detector circuitry 117 can be configured to determine the digital symbols stored in the memory cells based on an estimation of the extent to which charge leakage and/or disturb effects have altered the threshold voltage of the memory cells. In these cases, reference voltages that are shifted to compensate for the expected changes in the threshold voltages of the memory cells are not necessarily used. The detector circuitry 117 determines the digital symbols read from the memory cells based on the estimation of the extent to which charge leakage and/or disturb effects have altered the threshold voltage of the memory cells. For example, the estimation may be accomplished using a charge loss/charge gain model for the memory cells, expressed as $U_j$ may be determined using a charge loss/gain model of the memory cell, expressed as $f(U_1, U_2, U_3, \ldots U_j)$, where $U_1, U_2, U_3 \ldots U_j$ are charge loss/gain parameters such as those discussed below.

The memory controller 120 sends an output that includes configuration information to the memory read channel detector circuitry 117. For example, in some cases, the configuration information may include reference voltages to be used for the read operations. In some cases, the configuration information may include an estimation of the extent to which charge leakage and/or disturb effects have altered the threshold voltages of the memory cells, e.g., as based on a charge loss/gain model of the memory cells. The detector circuitry 117 uses the configuration information during a read operation of the data unit.

The memory controller 120 may also include memory device E/W information storage 124 that can be used to store E/W information for one or multiple data units and/or E/W information that is common to multiple data units. In some cases, the memory device E/W information storage 124 may be located somewhere other than the controller, such as in the memory cell array 115 or the host 130. The read channel configuration circuitry 161 uses the E/W information stored in the memory device E/W information storage 124 and/or the data unit headers to configure the read channel for read operations.

Figure 1D:
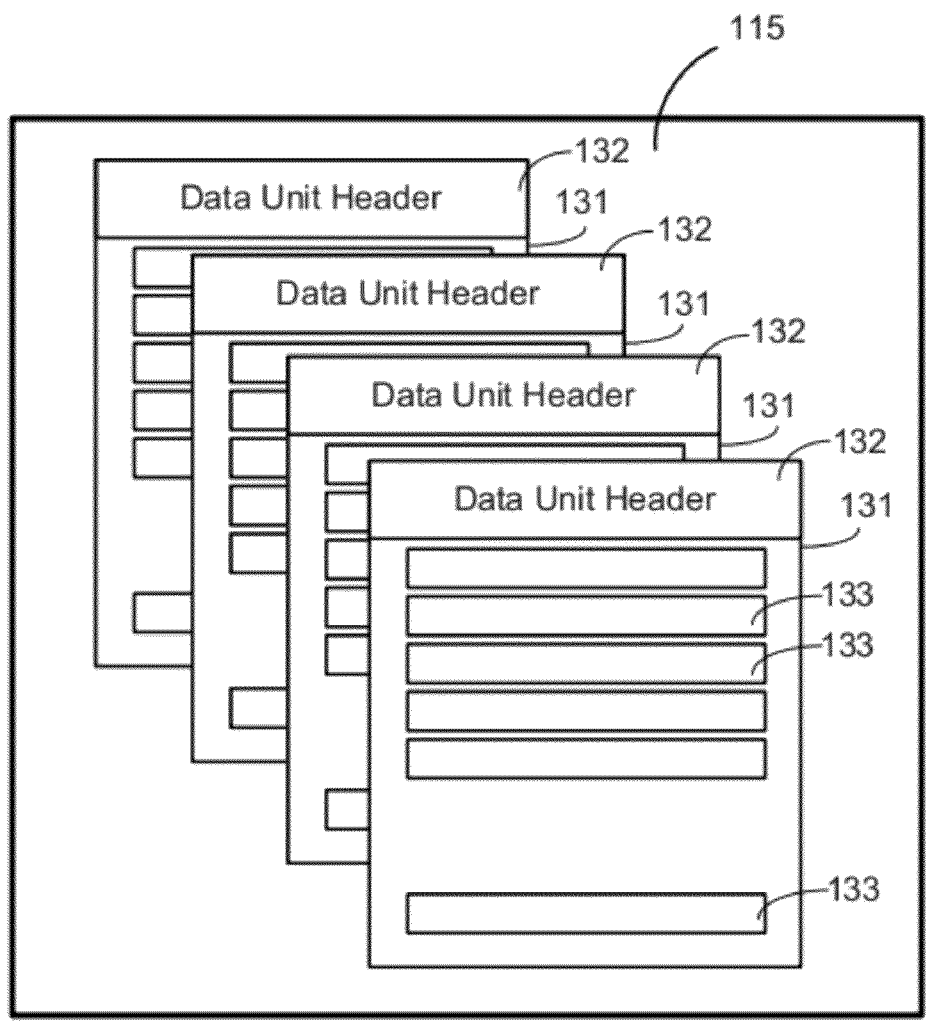
FIG. 1D illustrates the memory cell array of FIG. 1B in more detail.
Figure 2A:
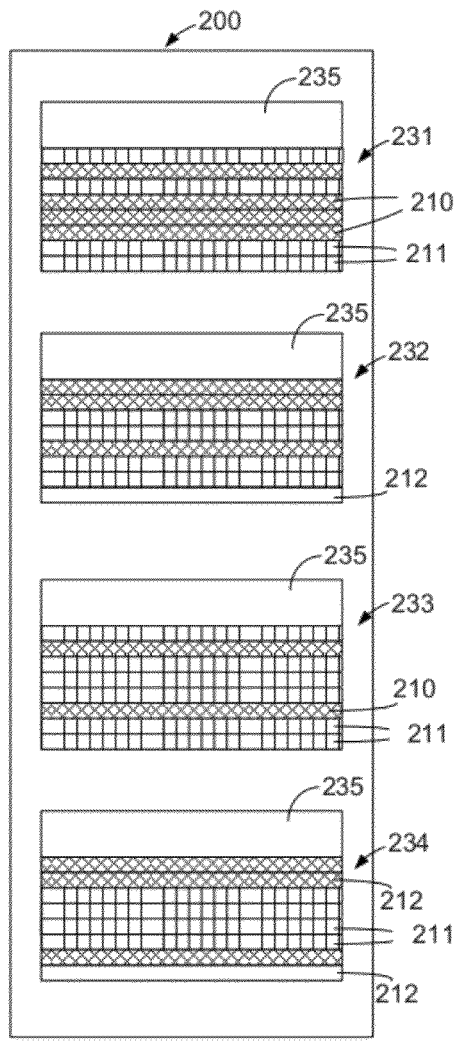
FIGS. 2A-2B illustrate a garbage collection operation involving several data units.

FIG. 1D illustrates the memory cell array 115 in more detail. As previously discussed, the memory cell array is organized into a number of data units 131. The data units 131 may correspond to a block of memory cell pages, may correspond to multiple blocks of memory cell pages, or may correspond to any other unit of memory cells. The data units 131 can be organized in one or more pages 133. In some cases, each data unit 131 includes a data unit header 132 that provides a storage area for E/W information for the data unit. In some implementations, the data units 131 may correspond to erasure units that are erased and written during a garbage collection operation. Garbage collection involving a memory device 200 including several data units 231-234 is illustrated with reference to FIGS. 2A-2B. At the time of garbage collection, as illustrated in FIG. 2A, the data units 231-234 of the memory device 200 include pages 211 storing valid data, pages 210 storing expired data that is no longer valid data, and open pages 212 that have not been written to since erasure of the data unit.

Figure 2B:
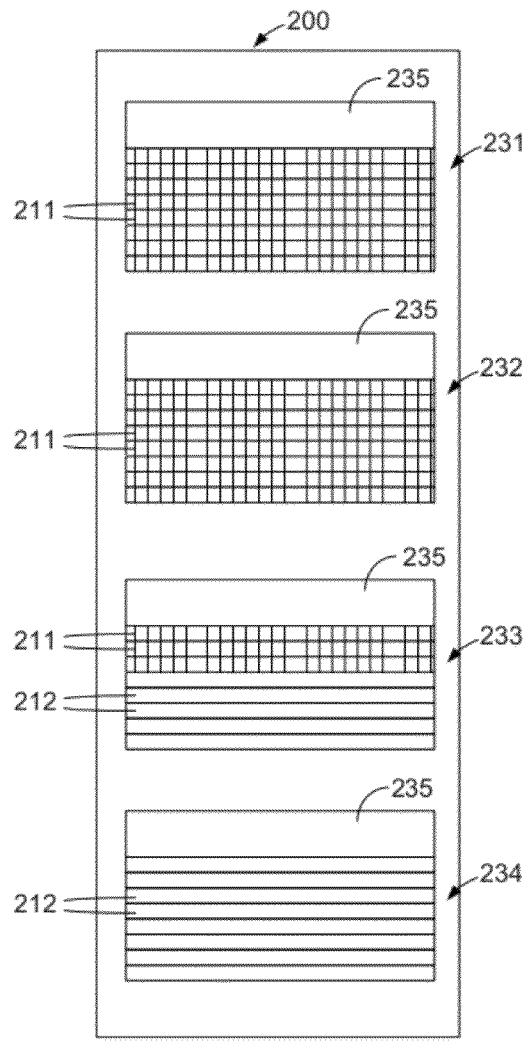
Figure 2C:
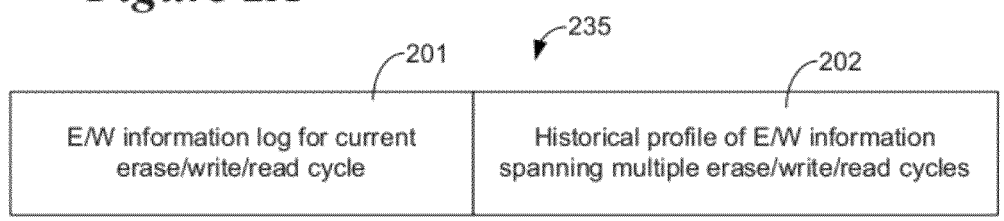
FIG. 2C depicts a data unit header capable of storing read/write channel parameters.

FIG. 2B illustrates the data units 231-234 after the garbage collection operation. The data units 231-234 include data units 231, 232 with all pages 211 storing valid data, data units 233 with some pages 211 storing valid data, and some open pages 212, and data unit 234 in which all pages 212 are open. In some cases, each of the data units 231-234 includes a header 235, as illustrated in FIG. 2C, that can store E/W information. The E/W information may comprise a write operation log 201 that includes E/W information for the current erase/write cycle and/or a historical profile 202 of the E/W information spanning multiple erase/write cycles. For example, the E/W information log for the current erase/write cycle may include one or both of write time information and write temperature information. In some implementations, the E/W information log for the current erase/write cycle may be stored in a location other than the data unit header. For example, the E/W information log for the current erase/write cycle may be stored elsewhere in the memory array and/or in the memory device E/W information storage 124 of the memory controller 120 (See FIG. 1C).

The E/W information log for the current erase/write cycle may comprise a log of time information indicating the time or times that the data unit was written to during the current erase/write cycle. In some cases, the log of time information may include one or more timestamps that indicate the write times of the data unit. In some cases, the log of time information may include one or more write sequence numbers from which the write times of the data unit can be determined.

Write sequence numbers can implicitly include write time information. In one scenario, each write operation has an associated sequence number which is incremented for each write operation. The write cycle rate, e.g., the number of write operations per unit time, is known. Thus, the write time can be estimated based on the sequence number and the write cycle rate. In another scenario, the write sequence number is incremented as a function of time. For example, all write operations written within a first time period are associated with a first sequence number. After expiration of the first time period, the sequence number is incremented to a second sequence number and write operations that occur during a second time period are associated with the second sequence number, etc.

For example, in one scenario, the data unit header may store one timestamp and/or write sequence number if all or a majority of the pages of the data unit are written at about the same time, i.e., substantially contemporaneously. The term substantially contemporaneously in this context refers to operations or events that occur within a predetermined time period that is short in comparison with the expected retention time of the data within the memory cells. For example, the predetermined time period within which substantially contemporaneous write operations are performed may be a few seconds, minutes, hours, or days, whereas the expected retention time of the data stored in the data unit is on the order of months or years. The data unit header may include multiple timestamps and/or sequence numbers if the pages of the data unit are written to at multiple times that are not substantially contemporaneous. For example, the header may include a first timestamp and/or sequence number indicating the first time that a first group of pages of the data unit are written to and a second timestamp and/or sequence number indicating a second time that a second group of pages are written to.

The E/W information log of the current erase/write cycle may comprise a log of temperature parameters that indicate the write temperature of the one or more write operations of the current erase/write cycle. For example, the data unit header may include one write temperature if all or a majority of the pages of the data unit are written substantially contemporaneously. The data unit header may include multiple write temperatures if the pages of the data unit are written to at multiple times that are not substantially contemporaneous. For example, the header may include first temperature information indicating the temperature at the first time that a first group of pages of the data unit are written to and second temperature information indicating the temperatures at a second time that a second group of pages are written to.

Garbage collection operations provide opportunities for collecting erase/write cycle time and temperatures because garbage collection can produce data units in which all, most, or many of the pages are written substantially contemporaneously. Other operations that involve mass write operations may produce similar results to garbage collection with regard to producing data units wherein all or most of the pages of the data unit are written to substantially contemporaneously.

Figure 3A:
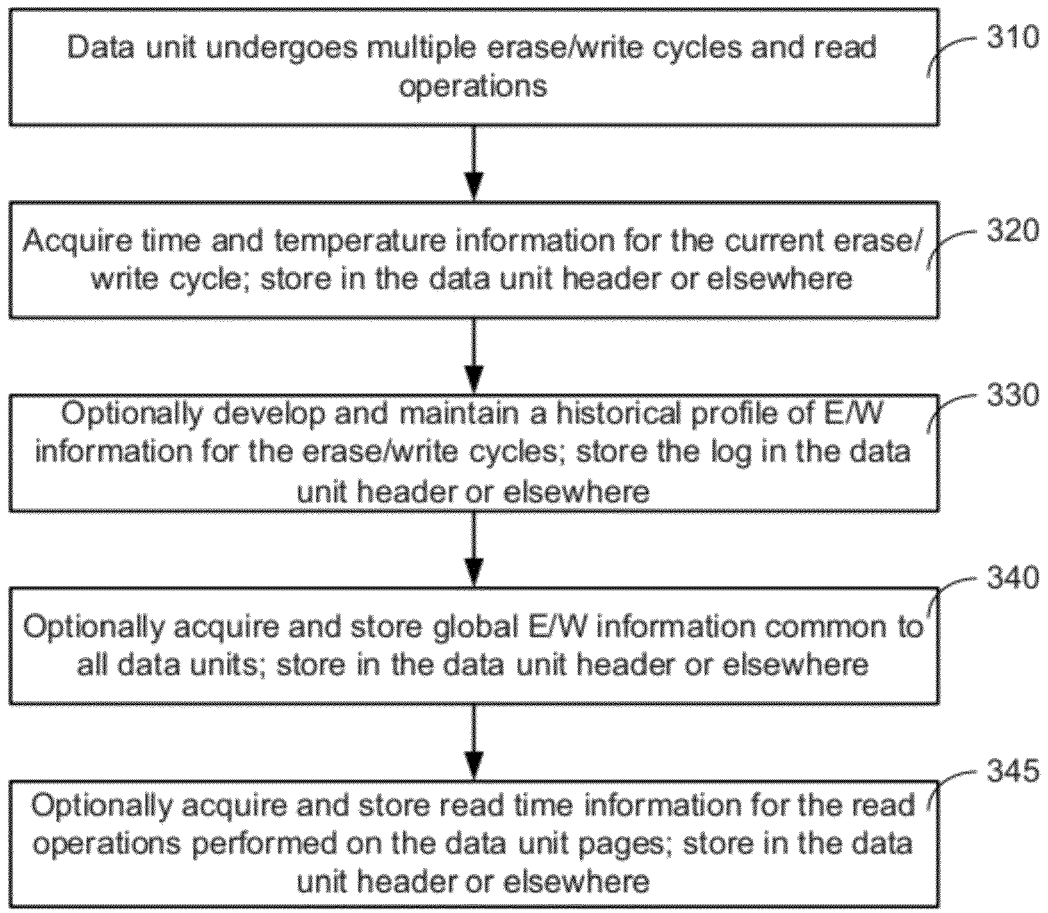
FIG. 3A is a flow diagram of a process for acquiring parameters of the current erase/write cycle of a data unit, a historical profile spanning multiple previous erase/write cycles of the data unit, and one or more parameters of the memory device that are common to all data units.

The flow diagram of FIG. 3A illustrates a process for acquiring and storing E/W information for a particular data unit. In this example process, the E/W information includes an E/W information log for the current erase/write cycle of the data unit. Optionally a historical profile of E/W information spanning multiple previous erase/write cycles of the data unit is developed and stored. Optionally, global E/W information that is common to the data unit and one or more other data units of the memory device is acquired and stored. For example, the E/W information log for the current erase/write cycle may include a log of erase times and/or write times and/or write temperatures of the current erase/write cycle. The historical profile may include the number of previous erase/write cycles and/or the write temperatures of previous erase/write cycles. The global E/W information that is common to the data unit and one or more additional data units may include information about the operating temperature of the memory device.

Referring now to FIG. 3A, the data unit undergoes 310 multiple erase/write cycles in which the memory cells of the data unit are erased, written to, erased again, written to again, etc. During each erase/write cycle of the data unit, time and temperature information for the erase/write cycle of the data unit is acquired and stored 320 in the data unit header or elsewhere as a log of current erase/write cycle. Optionally, information from each of the erase/write cycle logs is used to develop 330 a historical profile that includes, for example, the number of erase/write cycles experienced by the data unit and/or the write temperatures of the write operations experienced by the data unit. This historical profile of the erase/write cycles may be stored and maintained in the data unit header or elsewhere, such as the memory device E/W information storage. If the historical profile is stored in the data unit header, maintaining the historical profile of the data unit may involve temporarily relocating the historical profile of E/W information while the data unit is undergoing an erasure operation and then returning the historical profile back to the data unit header so that the historical profile of the data unit is maintained in the data unit. Optionally, global E/W information that is common to the data unit and at least one other data unit of the memory device is acquired and stored 340. For example, the global E/W information may include the operating temperature of the device which is periodically sampled and stored in the memory device E/W information storage. Optionally, read time information for read operations performed on the data unit pages may be acquired and stored 345 in the data unit header or elsewhere.

Figure 3B:
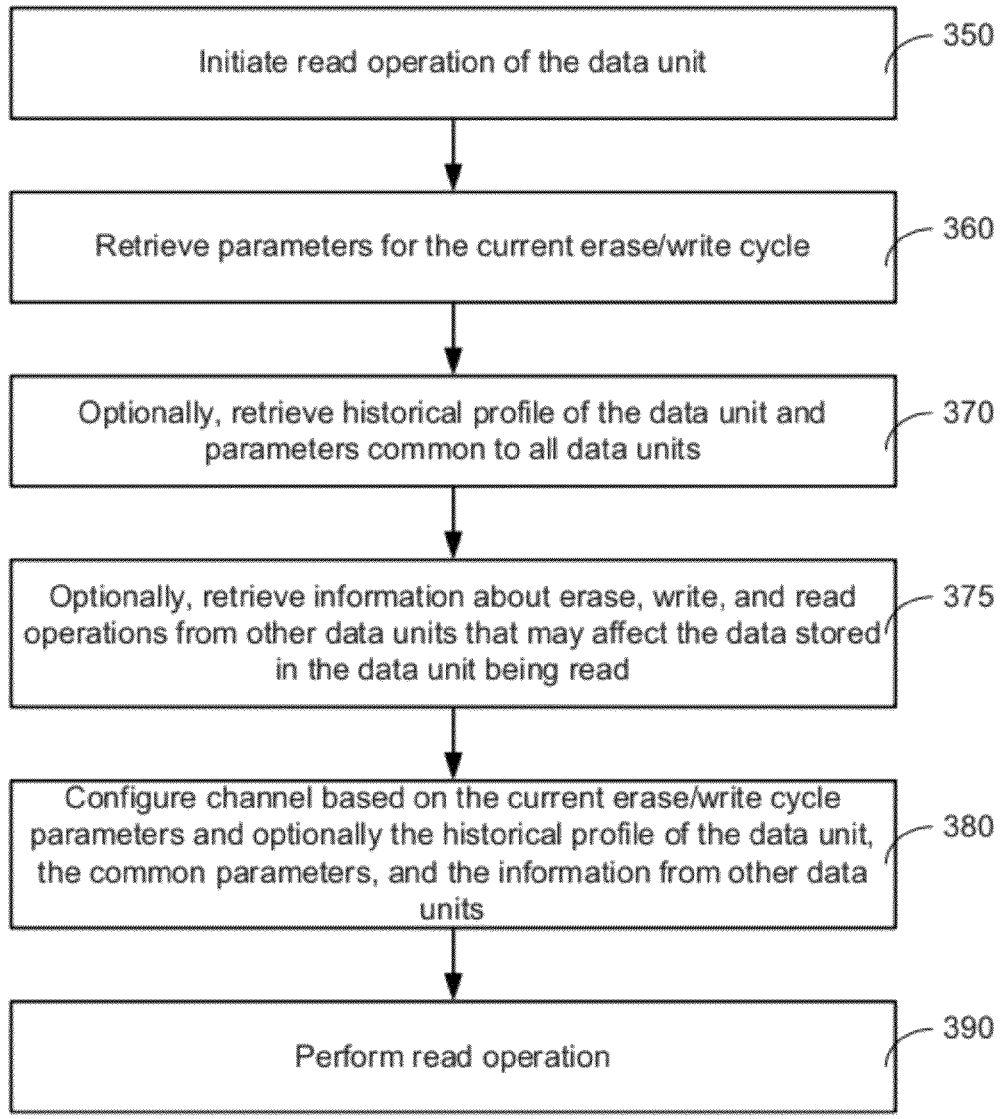
FIG. 3B is a flow diagram that depicts a process for configuring a read channel using parameters of previous erase/write operations.

The flow diagram of FIG. 3B depicts a process for configuring a read channel using information from one or more erase/write operations of the data unit. Referring now to FIG. 3B, a read operation of the data unit is initiated 350. Time and temperature information for the most recent erase/write cycle of the data unit are retrieved 360. Optionally, the historical profile of prior erase/write cycles of the data unit and/or the operating temperature of the memory device are retrieved 360, 370. Optionally information of other certain other data units is retrieved 375, e.g., from the data unit headers of the other data units. For example, the information retrieved form the other data units may include the times of erase, write, or read operations performed on the pages of the other data units. In some cases, depending on the circuit arrangement of the memory cells, the erase, write and/or read operations performed on other data units may affect the threshold voltages of the data unit memory cells being read. The retrieved parameters are used to configure 380 the read channel, and the read operation is performed 390 using the configured read channel.

Figure 3C:
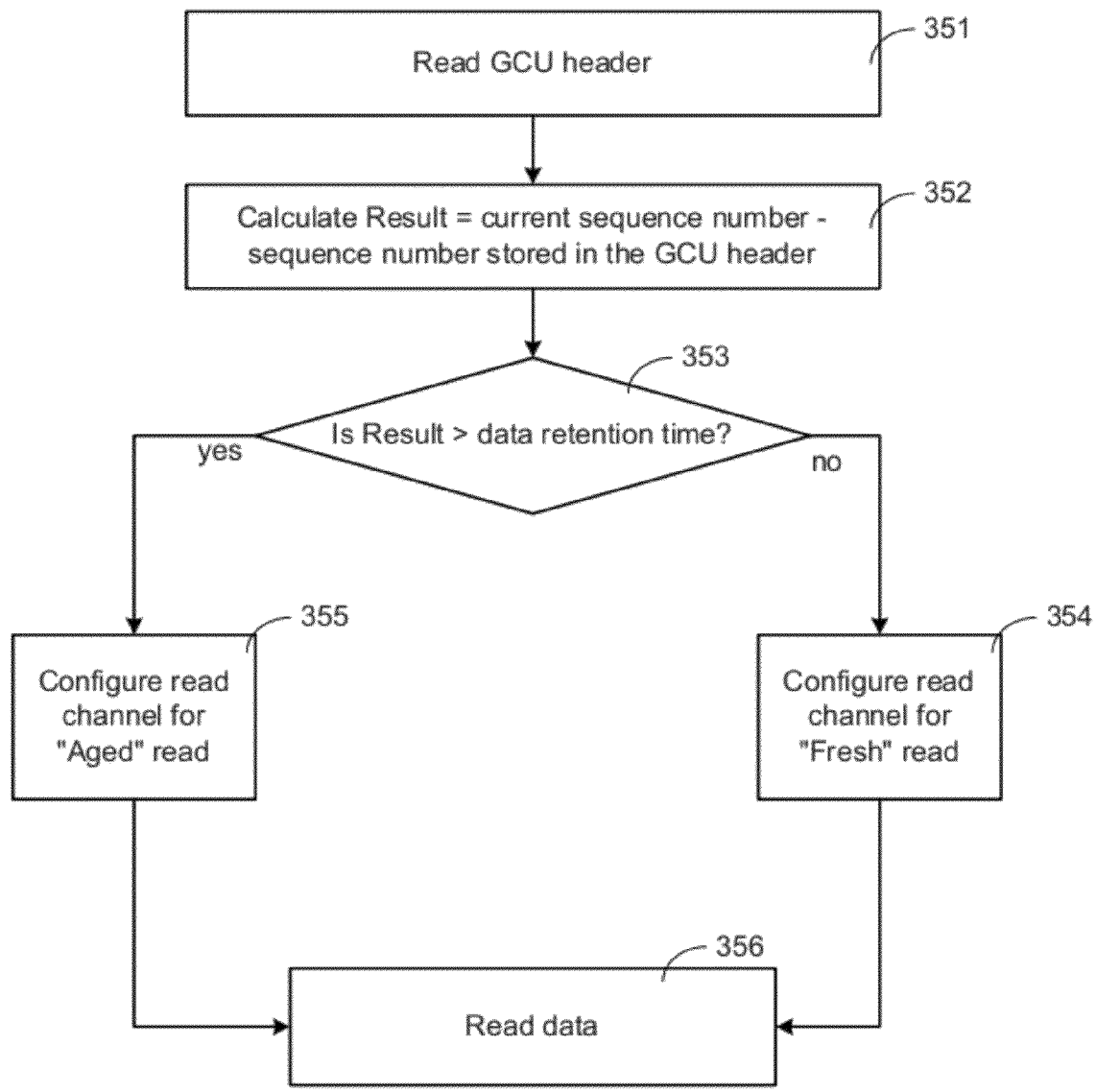
FIG. 3C is a flow diagram of a process of configuring a read channel using time information.

The flow diagram of FIG. 3C illustrates a process of configuring a read channel using time information stored in a data unit header. In this example, data unit is a garbage collection unit and the E/W information stored in the data unit header includes the sequence number of the garbage collection unit (GCU). Each GCU that undergoes garbage collection is associated with a sequence number that is stored as E/W information in the GCU header. The sequence numbers of the GCUs increase as each GCU undergoes garbage collection. Thus, the elapsed time since the last garbage collection operation was performed on the GCU can be estimated from the sequence number stored in the GCU header. In some implementations, the sequence number occupies 32 bits of the GCU header. Prior to reading data from the GCU, the information in the GCU header is accessed 351. The sequence number stored in the GCU header is subtracted 352 from the current sequence number. If the result of the calculation is greater than 353 a predetermined retention time, then the read channel is configured 355 for an "aged" read. If the result of the calculation is less than 353 a predetermined retention time, then the read channel is configured 364 for a "fresh" read. The read operation is performed 356 using the configured read channel.

Figure 3D:
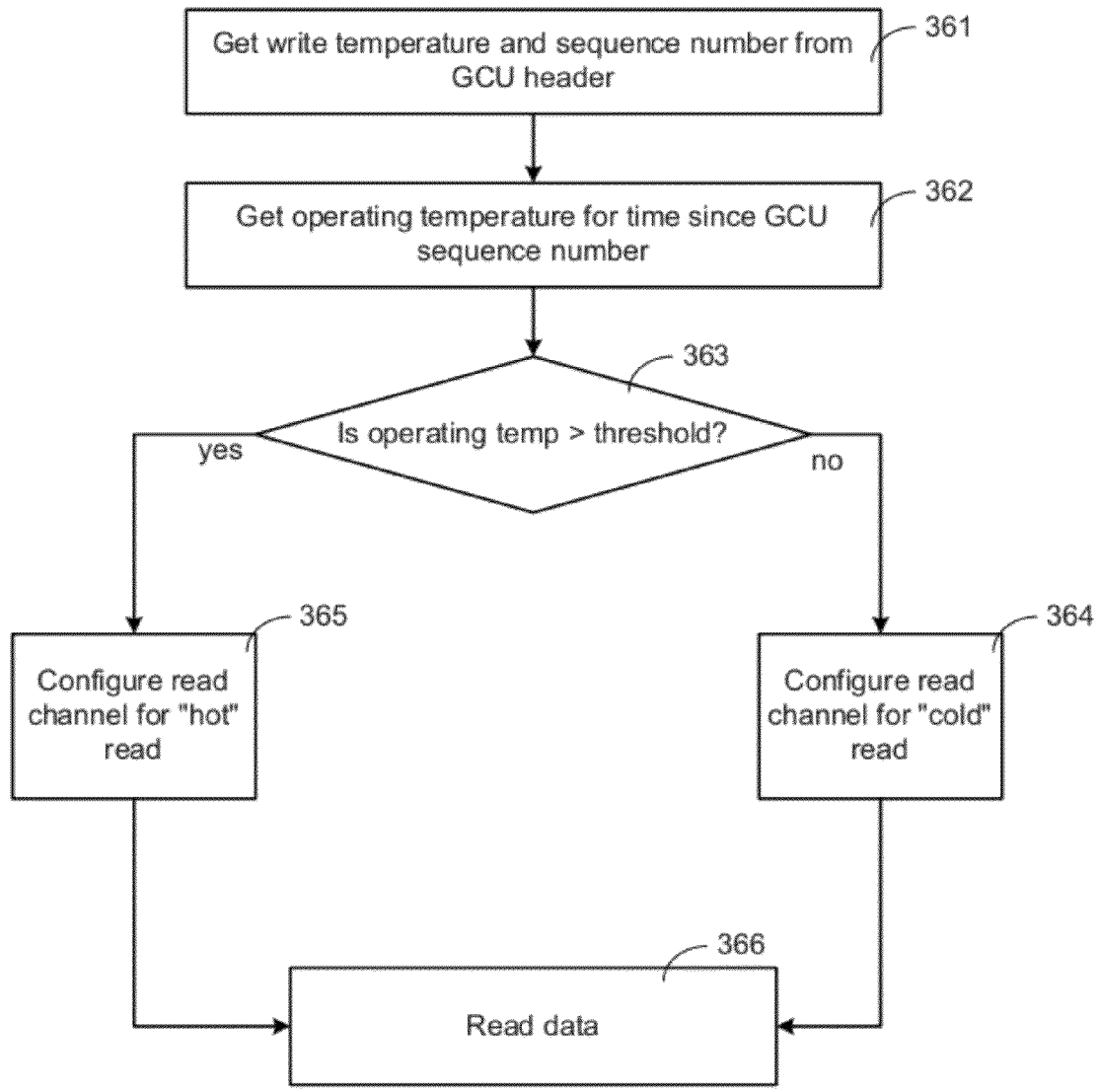
FIG. 3D is a flow diagram of a process of configuring a read channel using temperature information.

The flow diagram of FIG. 3D illustrates a process of configuring a read channel using temperature information. In this example, data unit is a garbage collection unit and the E/W information is stored in the data unit header includes the sequence number of the garbage collection unit (GCU) and the write temperature of the previous write operation of the GCU. In some implementations, the sequence number occupies 32 bits of the GCU header and the write temperature occupies 8 bits of the GCU header. Prior to reading data from the GCU, the information in the GCU header is accessed 361 and the sequence number of the GCU is retrieved. The operating temperature for the GCU since the sequence number is determined. If the operating temperature of the GCU is greater than 363 a threshold, then the read channel is configured 365 for a "hot" read. If the operating temperature is less than 363 the threshold, then the read channel is configured 364 for a "cold" read. The write temperature of the previous write operation may be used to configure the read channel. The read operation is performed 366 using the configured read channel.

Configuration of the read channel may include adjusting the reference voltage or reference voltages used to determine the analog threshold voltages present on the memory cells. The reference voltages can be adjusted to compensate for charge leakage. Additionally, or alternatively, the reference voltage can be adjusted to compensate for erase, write, or read operations performed on nearby data units that could affect the data stored in the data unit currently being read. The read operation is performed using the configured read channel.

The information acquired and stored for the current erase/write cycle, e.g., time, and/or temperature of the each write operation of the erase/write cycle, and or read operation times may be stored in the data unit header in a variety of configurations. Several configurations for storing the erase, write, and/or read information are discussed herein, although a complete listing of all the different configurations that could be used is prohibitive due to the number of possible configurations. All such configurations are considered to fall within the scope of this disclosure. The configurations used for storing the E/W information can be dynamically altered to increase or decrease the amount of information stored.

The configuration used to store the E/W information log for a current erase/write cycle may depend upon the number of write operations that occur within the erase/write cycle. For example, flash memory cells are erased before they are written to and are not re-written between erase operations. Instead of re-writing a page, if data that has been written to the flash memory page becomes invalid, the page is marked as invalid and the valid data is written to another page. Thus, each erase/write cycle for a data unit (group of memory cell pages) includes one erase operation in which the pages of the data unit are erased substantially contemporaneously and at least one write operation and potentially multiple write operations for the data unit. If the erase/write cycle includes multiple write operations, each of the write operations operates on a different group of pages within the data unit. Thus, in less complex scenario, an erase/write cycle for a data unit may involve only one erase operation that erases the entire data unit and only one write operation that writes data substantially contemporaneously to the entire data unit, as illustrated, for example by data units 231 and 232 of FIG. 2B.

In a complex scenario, the erase/write cycle includes an erase operation that erases all the pages of the data unit and a large number of write operations, e.g., one write operation per page of the data unit. In a moderately complex scenario, the erase/write cycle includes an erase operation that erases all of the pages of the data unit and several write operations, e.g., 2-4 write operations. Each of these multiple write operations writes to a group of pages of the data unit substantially contemporaneously.

Figure 4:
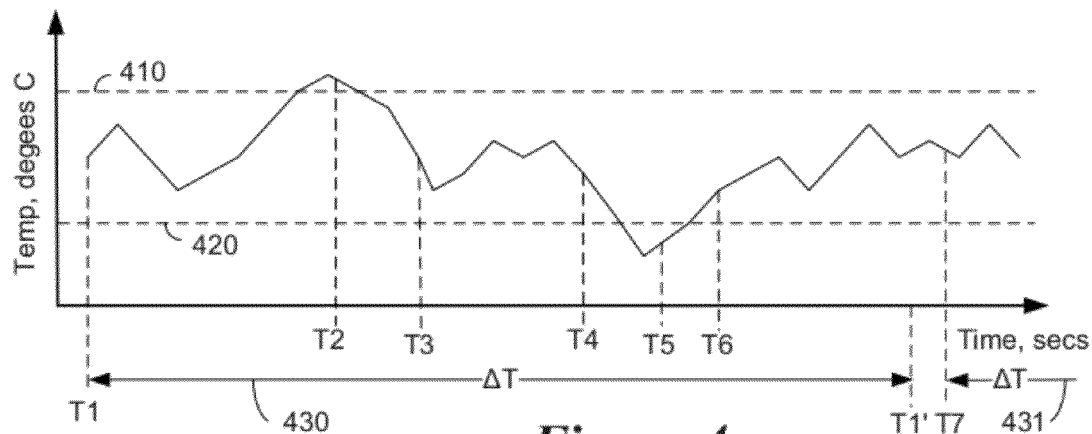
FIG. 4 is a graph illustrating the temperature variation of a memory device over a period of time.
Figure 5A:
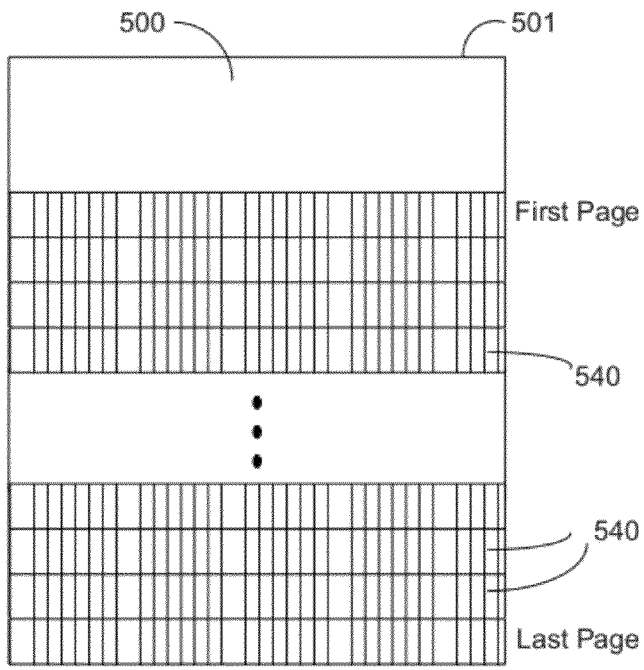
FIG. 5A illustrates a data unit following a bulk write operation that writes all of the pages of the data unit 501 substantially contemporaneously and at substantially the same write temperature.
Figure 5B:
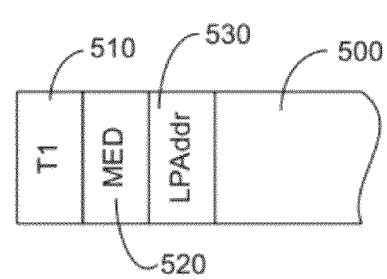
FIG. 5B depicts the data unit header following the bulk write operation of FIG. 5A.

Several processes and configurations for storing the current erase/write cycle time and temperature parameters are illustrated with reference to FIGS. 4 through 7B. FIG. 4 is a graph illustrating the temperature variation of a memory device over a period of time. The temperature is sensed by the memory device temperature sensor 118 (FIG. 1B). In these examples, the write operations are identified as occurring at hot temperature, corresponding to temperatures above hot threshold 410, occurring at medium temperature, corresponding to temperatures between the hot threshold 410 and the cold threshold 420, or occurring at cold temperature, corresponding to temperatures below the cold threshold 420. The stored write temperature parameter for any particular write operation can correspond to one of the three zones, hot, medium, or cold. Although in this example, the temperature range is divided into three zones, alternatively, the write temperature parameter that is stored could identify any number of temperature zones, and/or the stored temperature parameter could be a measured analog temperature value, for example.

Several examples of the data unit header 500, 600, 700 are illustrated in FIGS. 5A and 5B, 6A-6G, and 7A and 7B with reference to the time and temperature graph of FIG. 4. In one example, illustrated in FIGS. 5A and 5B, the current erase/write cycle of the data unit 501 involves a bulk write operation (e.g., during garbage collection) that writes all of the pages 540 of the data unit 501 substantially contemporaneously at time T1 and at substantially the same write temperature. The shading in FIG. 5A indicates pages that were written to during the write operation, which in this example includes all pages 540. The time parameter of the write operation, T1 510, the temperature parameter of the write operation, MED 520, and the address of the last page in the data unit written by the write operation, LP Addr 530, are stored in the data unit header 500 illustrated in FIG. 5B. The time parameter, T1 510, includes information from which the time that the pages through LP Addr 530 were written, e.g., a time stamp of the write time or a sequence number from which the write time can be derived. The temperature parameter, MED 520, indicates that the write operation occurred at a medium write temperature between the hot threshold 410 and the cold threshold 420. In this example, LP Addr 530 stored in the data unit header 500 indicates that all of the pages 540 of the data unit 501 were written during the bulk write operation.

Figure 6A:
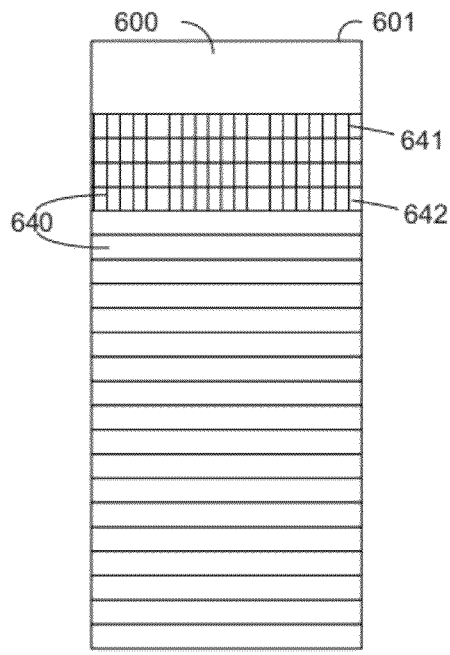
FIGS. 6A-6F illustrate a data unit during an erase/write cycle that includes multiple write operations.

The data unit header 600 shown in FIGS. 6A-6G illustrates a scenario in which the erase/write cycle for the data unit includes multiple write operations. In this example, updating the data unit header 600 for the current erase/write cycle occurs if either a write operation occurs and the temperature has transitioned beyond predetermined temperature thresholds 410, 420 and/or if the write time of the write operation exceeds a predetermined temperature interval, ΔT 430. FIG. 6A shows a data unit 601 having pages 640 after the first write operation of the erase/write cycle. The first write operation writes pages 641 through 642 substantially contemporaneously at time T1. In FIGS. 6A-6F, the shading indicates pages that have been written to and the unshaded pages are those that have been erased but not written to.

Figure 6B:
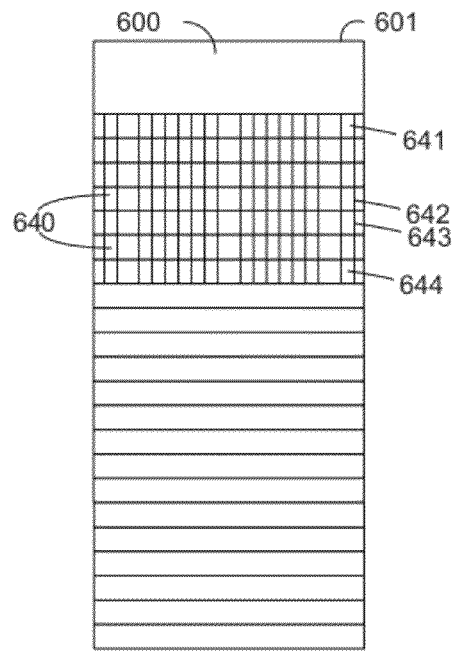
Figure 6C:
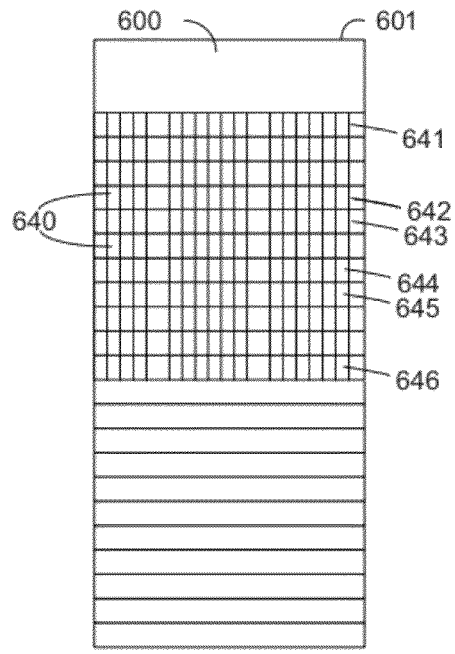
Figure 6D:
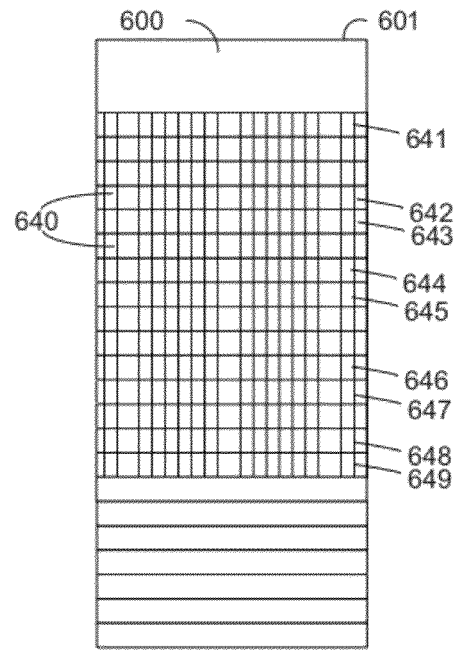
Figure 6E:
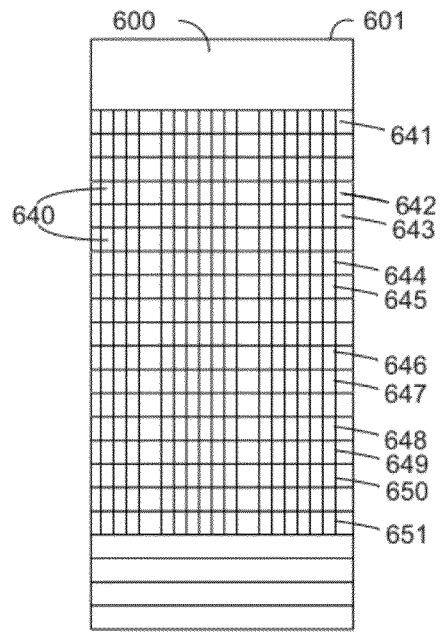
Figure 6F:
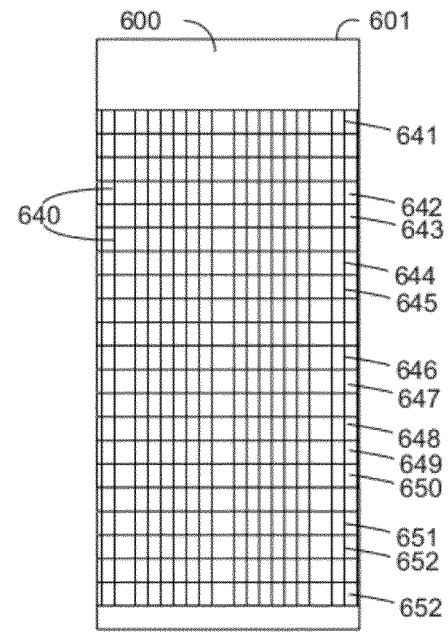
Figure 6G:
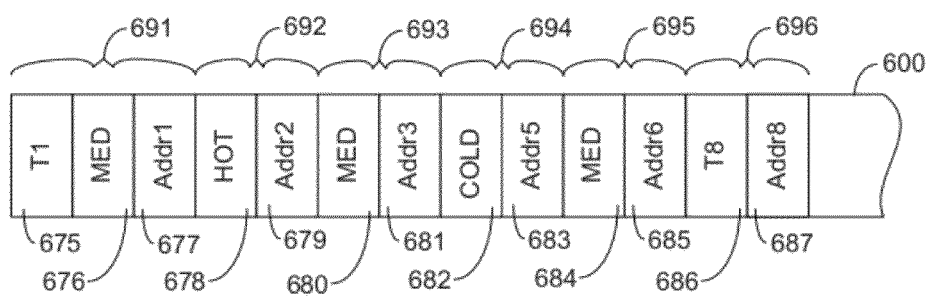
FIG. 6G shows the data unit header following the erase/write cycle of FIGS. 6A-6F.

The data unit header 600 is updated with the first write operation information 691, as illustrated in FIG. 6G. The first write operation information 691 includes time information, T1 675, indicating the time that the first write operation occurred, temperature information, MED 676, indicating that the first write operation occurred when the temperature of the memory device was in the medium zone between the hot threshold 410 and the cold threshold 420, and Addr1 677, indicating the pages that were written during the write operation. In this example, because the pages are sequentially written starting with the first page 641, the starting page of the write operation is known, and only the address location, Addr1, of the last page 642 written to during the first write operation is stored in the data unit header 600. In other embodiments, additional information, e.g., a starting page address, or page address locations for each page written, may be needed to identify the pages written to during any particular write operation.

At time T2, a second write operation occurs. A data unit header update is triggered if a write operation occurs and the temperature has varied beyond the write temperature of the last write operation and/or the time interval from the previous write operation exceeds the time limit for substantially contemporaneous write operations, e.g., $\Delta T$ 430. During the second write operation, the write temperature has transitioned into the hot temperature zone from the medium zone. The change in the write temperature of the second write operation as compared to the write temperature of the first write operation triggers a data unit header update. During the second write operation, a second group of pages, pages 643 through 644, is written as indicated in FIG. 6B. Pages 643 through 644 are considered to be written substantially contemporaneously with the first pages written, pages 641 through 642, because the time since the first write operation has not exceeded the time interval, $\Delta T$ 430. Therefore, the time information, T2, for the second write operation is not written again to the data unit header 600, because it was previously written during the first write operation. However, because the write temperature has varied past the hot threshold 410, the data unit header 600 is updated as indicated in FIG. 6G with E/W information 692 of the second write operation, including the temperature information indicting the temperature of the second write temperature, HOT 678, and address location, Addr2 679, of page 644 which is the last page written during the second write operation.

FIG. 6C illustrates the data unit 601 after a third write operation. A data unit header update is triggered by the third write operation because the temperature of the third write operation has dropped below the hot threshold 410 and back into the medium zone. During the third write operation, pages 645 through 646 are written into the data unit 601. The time interval has not exceeded the time limit for substantially contemporaneous write operations, $\Delta T$ 430, thus pages 645 through 646 are considered to have been written substantially contemporaneously with the pages written during the first and second write operations. The data unit header 600 is updated with the E/W information 693 of the third write operation, including an indication of the write temperature, MED 680, and the address location of the last page written to during the third write operation, Addr3 681.

The fourth write operation at time T4 indicated in FIG. 4 does not trigger an update of the data unit header 600 because the fourth write operation occurs within the same temperature zone as the third write operation and within the time interval $\Delta T$ 430 for substantially contemporaneous write operations. Pages 647 through 648 are written during the fourth write operation.

FIG. 6D illustrates the data unit after a fifth write operation which is triggered because the fifth write operation occurs after the temperature of the write operation has dropped below the cold threshold 420. One page, page 649, is written during the fifth write operation. The data unit header 600 is updated with the E/W information 694 of the fifth write operation, including an indication of the write temperature, COLD 682, and the address location of the last page written to during the fifth write operation, Addr5 683.

FIG. 6E illustrates the data unit after a sixth write operation which is triggered because the sixth write operation occurs after the temperature has increased above the cold threshold 420. Pages 650 through 651 are written during the sixth write operation. The data unit header 600 is updated with the E/W information 695 of the sixth write operation, including an indication of the write temperature MED 684 and the address location of the last page written to during the sixth write operation, Addr6 685.

At time T1', the time interval, $\Delta T$ 430, for substantially contemporaneous write operations expires. The data unit header 600 is updated for the seventh write operation that occurs at time T7 because the seventh write operation is not performed substantially contemporaneously with the previous six write operations performed, respectively, at times T1 through T6. The seventh write operation that occurs at T7 initiates another time interval, $\Delta T$ 431, for substantially contemporaneous write operations. As illustrated in FIG. 6F, pages 652 through 653 are written during the write operation that occurs at time T7. The data unit header 600 is updated with E/W information 696 for the seventh write information, including the write time information, T8 686, and the address of the last page written, Addr8 687. An indication of the write temperature does not need to be included in the E/W information 696 because the write temperature has not changed since the previous write operation at T6.

In some embodiments, storage of the E/W information is split between the data unit header and a location common to all data units. For example, in some cases, the temperature of the memory device may be periodically sampled and stored, along with an indication of the time at which the temperature samples were determined, in a location common to multiple data units. As illustrated in FIG. 7B, time and temperature information 706 of the memory device may be stored in the memory device E/W information storage 705 (also see element 124 of FIG. 1C).

In this example, for each data unit, the time of each write operation 771-777 and an indication of the pages written 781-787 during the write operation are stored in the data unit header 700 of the data unit. When the read channel is configured prior to a read operation, the write temperature of any write operation can be discerned by comparing the time of the write operation (obtained from the information stored in the data unit header 700) to the temperature and time information stored in the memory device E/W information storage 705. Both the write time and the write temperature can be used to adjust the read channel configuration and/or to develop the historical profile of the data unit.

The write temperature of the memory cells and the write time of the memory cells can be used to configure the read channel prior to a read operation. For example, before a page or group of pages of memory cells is read, the reference voltage used for the read operation may be adjusted based on the retention time (the difference between the time of the read operation and the time of the write operation), and the previous write temperature, which can be determined as the temperature corresponding to a write time of the page of memory cells. Additionally the read channel can be configured using information related to other operations which may affect the charge retained on the memory cells.

Figure 7A:
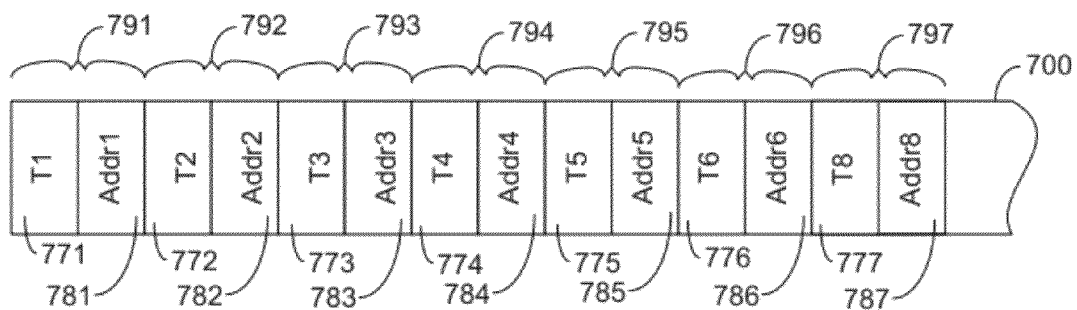
FIG. 7A shows a data unit header for an update configuration that includes storing the write time for each write operation of the erase/write cycle.
Figure 7B:
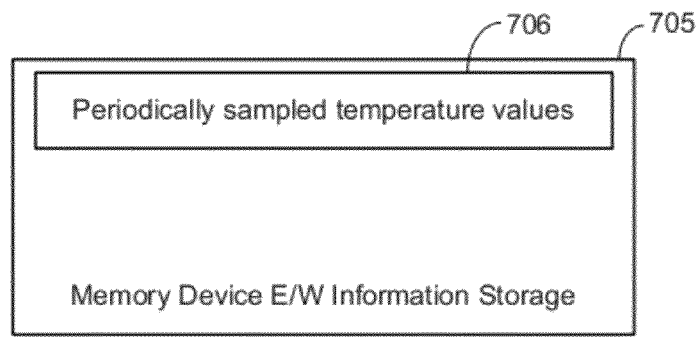
FIG. 7B illustrates periodically sampled temperature values for the memory device stored in a location other than the data unit header.

FIG. 7A illustrates a data unit header 700 after the write operations indicated in FIG. 4. After each of the write operations at times T1, T2, T3, T4, T5, T6, T7, the data unit header 700 is updated with the write operation parameters 791-797 which include the time 771-777 of the write operation and the pages written 781-787 during the write operation. In this example, the pages are sequentially written, so only the last page written is stored for each write operation, with the first page written during the current write operation assumed to be next page following the last page written during the previous write operation. Also, because the data unit header 700 is updated without considering the temperature of the write operation, the temperature zone thresholds are not implemented, and the data unit header is updated for each write operation, regardless of the temperature zone transitions between write operations. Note that in some cases, all of the E/W information for the current erase/write cycle may be stored in the memory device E/W information storage.

Figure 8A:
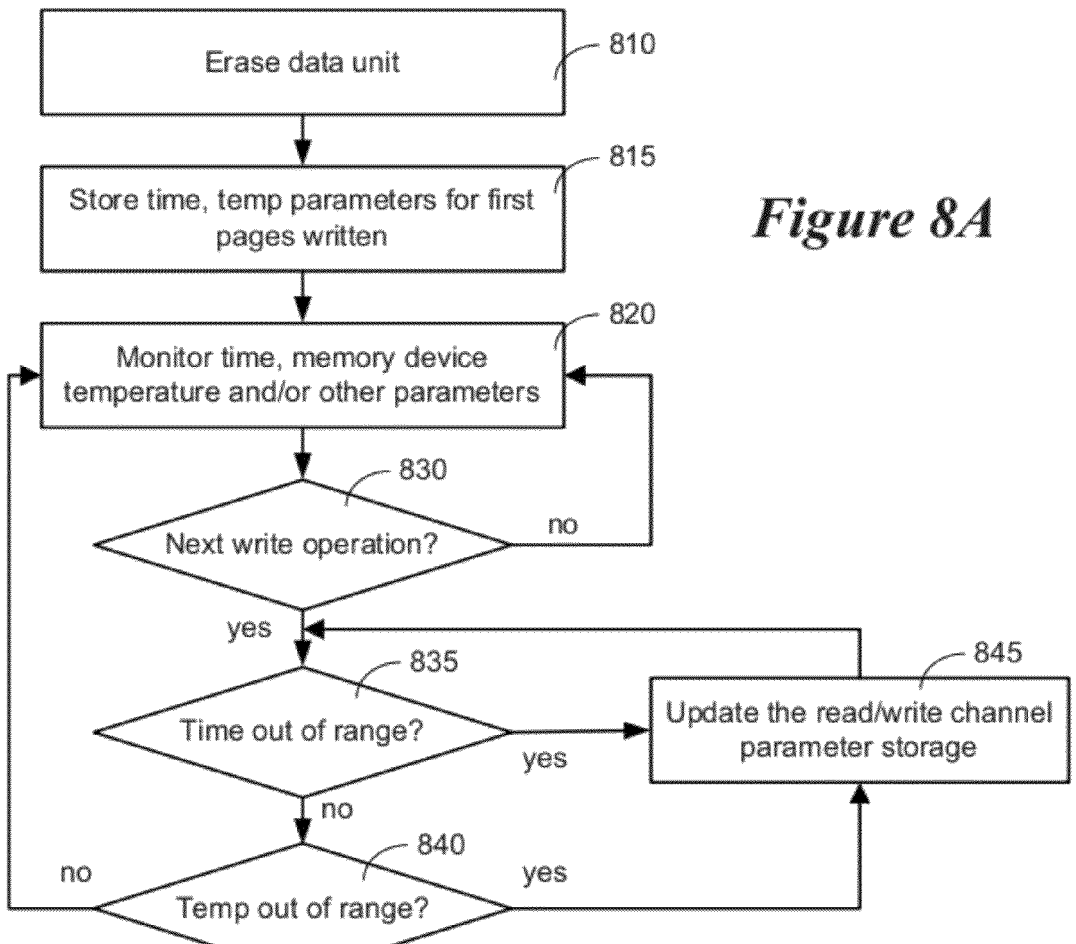
FIG. 8A is a flow diagram of a process of updating parameters of the write operations for a data unit.

FIG. 8A is a flow diagram of a process of updating parameters of the write operations for a data unit, as previously discussed in connection with FIGS. 6A-6G. Typically multiple data units are included in the memory device. The data units may be arbitrarily defined page groups that are erased as a unit, for example. Time, temperature, and/or other information useful for configuring the read channel may be monitored for each erase, write and/or read operation of the data unit. Initially, an erase operation is performed 810 on the data unit which erases all of the pages of the data unit. The initial write operation programs some or all of the pages of the data unit. The E/W information from the initial write operation for the pages written is stored 815. When the next write operation occurs 830, if the write parameters, e.g., time, 835, temperature 840 are out of range, then the data unit header (or other storage location) is updated with the E/W information for the write operation. If the write operation parameters are not out of range 835, 840, the E/W information for the write operation is not updated and continues to be monitored 820.

Figure 8B:
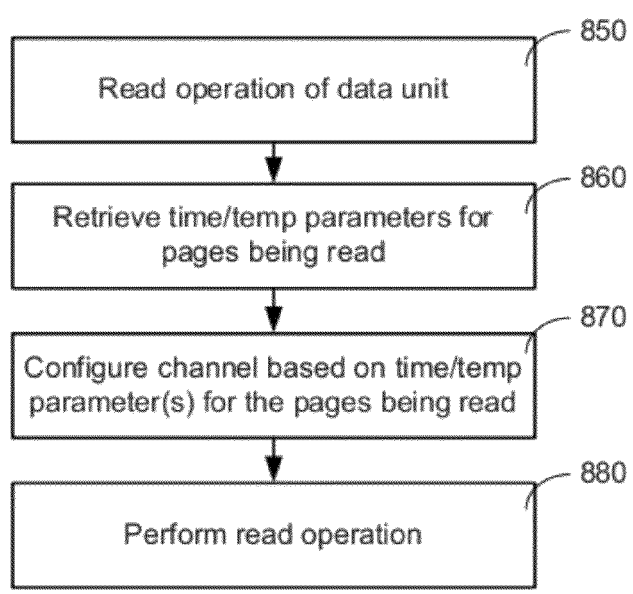
FIG. 8B is a flow diagram illustrating a read operation that includes configuring the read channel using the time and temperature parameters of a previous write operation.

As illustrated in FIG. 8B, when a read operation is initiated 850, E/W information from the previous write operations, e.g., write time, write temperature, and/or other information, is retrieved 860 from memory and/or is otherwise determined from the stored E/W information. The E/W information, e.g., write time, write temperature, for the pages to be read are used to configure 870 the read channel. The read operation is performed 880 on the pages using the configured read channel.

In some implementations, particularly where the storage capacity for the E/W information is a factor, the process used to update the information can be modified to reduce the amount of storage space required. In some cases, the storage capacity data unit header may be limited or may become limited as the space fills with E/W information entries. According to one technique, when capacity in the data unit header has diminished beyond a predetermined level, the configuration of the information previously stored in the data unit header may be modified. In one example, the E/W information stored in the data header may be compressed to increase the amount of available storage. Data compression may involve converting the data from individual samples of a parameter to a statistical value or function, such as mean or median value or a probability distribution, for example. In another technique, the process for acquiring the E/W information may be modified. For example, parameter thresholds and/or intervals used to trigger an update to the data unit header for future write operations may be initiated and/or adjusted to reduce the amount of information stored in the data unit header and thus stretch the capacity to be able to include information from more write operations.

It is possible for the number of updates to the data unit header to vary considerably, from the situation wherein one update of the data unit header is performed when only one write operation is performed during the erase/write cycle that writes to all pages in the data unit, to the situation wherein the data unit header is updated for each page in the data unit. Because of this wide variation in the number of write operations for each erase/write cycle, dynamic control of the configuration of the E/W information stored for the write operations and/or the process for storing the E/W information can be helpful. The controller may monitor the amount of storage remaining and dynamically reconfigure the E/W information and/or modify the process by which the E/W information is stored. Dynamic data compression can be used to free up additional storage capacity. Dynamic adjustment of parameter thresholds and/or intervals can be used to control the frequency of updates to the data unit header and/or other memory locations storing the E/W information, thus preventing the updates from exceeding the storage capacity of the storage locations.

Figure 9A:
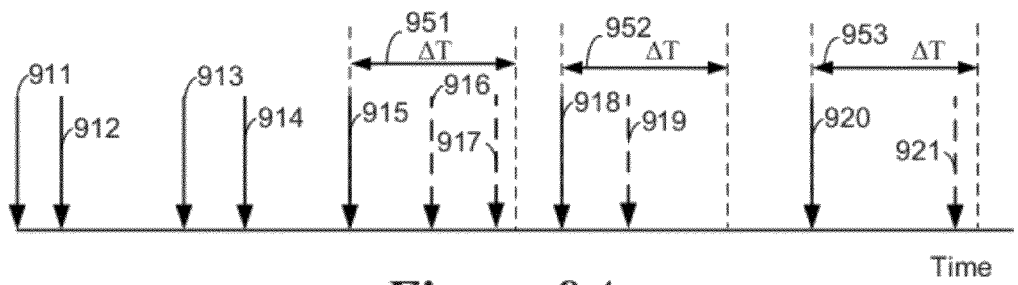
FIG. 9A illustrates dynamic modification of the configuration used to update the information stored in a data unit header for the current write operation.

Dynamic modification of the process used to update the E/W information log stored in a data unit header and/or the configuration of the E/W information previously stored in the data unit header is illustrated in FIG. 9A. In FIG. 9A, write operations that update the data unit header are indicated by solid downward arrows and write operations that do not update the data unit header are indicated by dashed downward arrows. In this example, the data unit header updates include the write time and pages written during the write operation.

Initially, data unit updates are performed for each write operation 911-914. However, after write operation 915, the frequency of the updates of the data unit header is dynamically decreased due to the implementation of the time interval, $\Delta T$ 951. After write operation 915, the data unit header is updated less frequently because the time interval, $\Delta T$, 951 is imposed. Write operations that fall within the $\Delta T$ interval from a previous data unit header update do not trigger an update the data unit header. Thus, write operations 916 and 917 which fall within the $\Delta T$ interval 951 of write operation 915 do not update the data unit parameter header. Write operation 918 is the first write operation that falls beyond the $\Delta T$ interval from write operation 915 and write operation 918 triggers an update of the data unit header and starts another $\Delta T$ interval 952. Write operation 919 falls within the $\Delta T$ interval 952 initiated by 918 and does not trigger a data unit header update. Write operation 920 falls beyond the $\Delta T$ interval 952 from write operation 918 and triggers an update of the data unit header and also starts another $\Delta T$ interval 953. Write operation 921 falls within the $\Delta T$ interval 953 initiated by 920 and does not trigger a data unit header update.

Figure 9B:
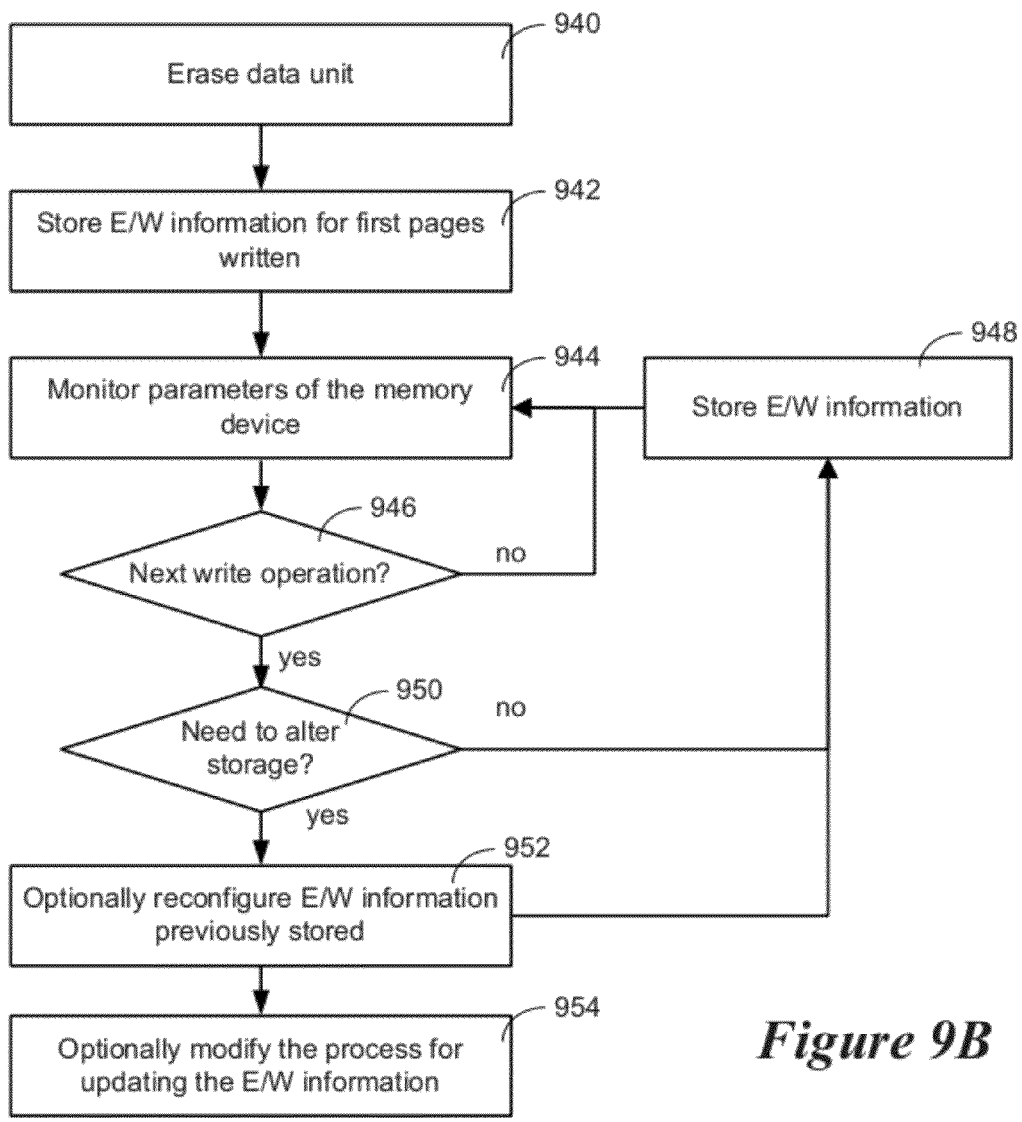
FIG. 9B is a flow diagram of a process that includes optionally reconfiguring information previously stored in the data unit header and optionally modifying the update configuration of the data unit header.

FIG. 9B is a flow diagram illustrating a method of dynamically implementing or adjusting the parameter thresholds used for updating the data unit header. In this example, the E/W information previously stored in the data unit header is reconfigured (e.g., compressed, combined, and/or deleted) and/or the update process for the data unit header is modified. As with other systems and methods described herein, the method described in connection with FIG. 9B is not necessarily specific to the data unit header, and a similar approach can be used to reconfigure previously stored information and/or modify the update process of any E/W information storage, e.g., the memory device E/W information storage.

The erase operation erases 940 all of the pages of the data unit. The E/W information for the first pages written are stored 942, e.g., in the data unit header. The E/W information, e.g., time and temperature of the memory device continue to be monitored 944, and the next write operation occurs 946. At the next write operation, the process determines 950 whether or not the update process for the data unit header needs to be altered and/or whether the previously stored information needs to be reconfigured.

To preserve storage capacity, the E/W information stored in the data header can be compressed, less E/W information may be stored for each write operation, the E/W information may be stored less frequently, and/or other reconfiguration of the E/W information and/or modifications to the process to collect E/W information may be initiated. For example, the E/W information previously stored in the data unit header may be reconfigured 952 to free up space for storage of future E/W information. In some cases, the previously stored information can be compressed and/or combined, and/or some of the previously stored information may be deleted. The data unit header update configuration may be modified 954 so that less E/W information is stored and/or the E/W information is written less frequently by imposing or increasing the parameter temperature thresholds and/or time intervals as previously discussed. Alternatively, if the process determines that a large amount of capacity is available and it is possible to store additional E/W information, the process for storing E/W information may be altered 954 to allow increased frequency and/or amount of E/W information storage. The E/W information is stored 948 using the modified data unit header update process.

As previously mentioned, in some cases, as an alternative or in addition to writing the E/W information to the data unit header, all or some portion of the E/W information may be written to a memory device E/W information storage location within the controller and/or the memory array and/or elsewhere in the memory system. Whereas the data unit header is located within each data unit, the memory device E/W information storage is a storage location common to multiple data units.

In some embodiments, in addition to storing a log of E/W information for an erase/write/read cycle of each data unit, a historical profile of each data unit that spans multiple erase/write/read cycles may be developed and stored. The historical profile for a data unit may be stored along with the E/W information log of the current erase/write/read operations in the data unit header (as illustrated in FIG. 2C) and/or in the memory device E/W information storage (see element 124 of FIG. 1C) that is commonly located with respect to multiple data units. As discussed in more detail below, the historical profile for the data unit may comprise an overall historical profile of the erase, write, and/or read operations for the entire data unit, a historical profile of the erase, write, and/or read operations for groups of pages within the data unit, and/or a historical profile of the erase, write, and/or read operations for each page within the data unit.

For example, the historical profile may include information about the number of erase/write cycles experienced by the data unit, groups of pages of the data unit and/or individual pages of the data unit. The historical profile may also include information about the number of write operations performed at, below or above particular temperatures or within temperature ranges. For example, since write operations at cold temperatures are more destructive to the memory cell oxide layer than write operations performed at higher temperatures, information about the number of cold write operations experienced by each data unit (or each page or groups of pages within the data unit) may be stored in the historical profile for the data unit. When compared with memory cells that have experienced a smaller number of erase/write cycles and/or a smaller number of write operations at cold temperatures, memory cells that have experienced a greater number of erase/write cycles and/or a greater number of destructive (cold) write operations may have a more pronounced threshold voltage shift when the memory cells are read. The historical profile may additionally or alternatively include other information that is useful for configuration of the read channel, such as the level and number of reference voltages previously and/or successfully used in prior read operations of the pages of the data unit, the error rate of the data unit pages, and/or other assumptions previously used to detect the analog voltages and/or successfully decode the data unit pages.

The historical profile may include the number of erase/write cycles experienced by the page or pages of the data unit and/or may include the temperature for each write operation experienced by the page or pages of the data unit. In some implementations, the historical profile may include the number of write operations below a certain temperature and/or may include a histogram of the number of write operations for various temperature ranges.

Figure 10A:
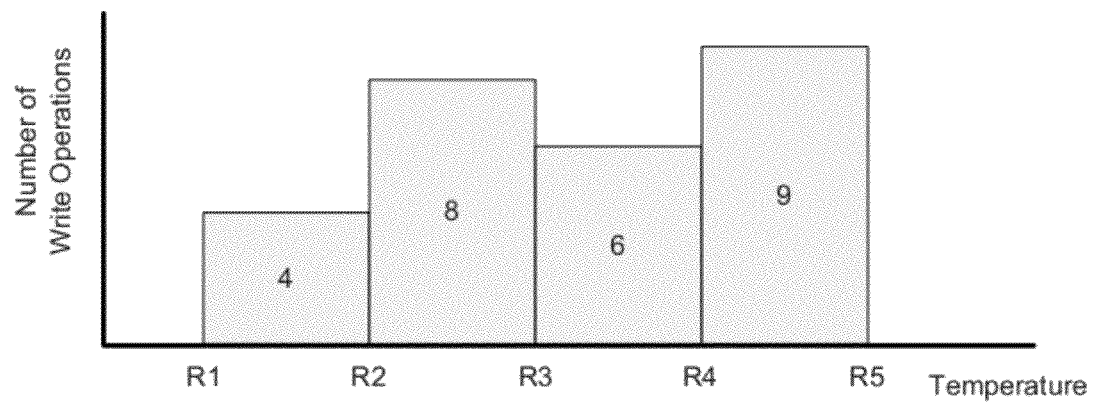
FIG. 10A shows a histogram that is produced by an initial write temperature historical profile update configuration.
Figure 10B:
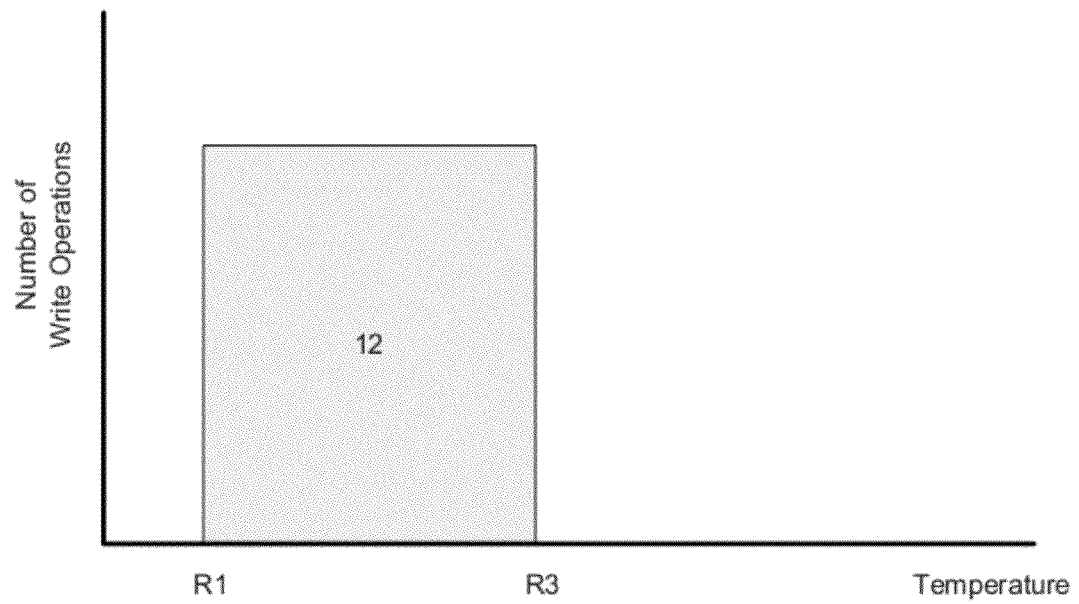
FIG. 10B shows a histogram after modification of the initial write temperature historical profile configuration.

In a process similar to the process previously discussed in connection with storing the E/W information log for erase/write/read cycles, after a number of erase/write/read cycles, the E/W information in the historical profile may optionally be reconfigured and/or the update process for the historical profile may optionally be modified as the amount of storage capacity for the E/W information decreases over time. An example of modifying the historical profile update configuration is illustrated by the histograms of FIGS. 10A and 10B. In this example, the historical profile includes write temperatures of the data unit. FIG. 10A shows a histogram that is produced by an initial write temperature historical profile update process. The initial write temperature historical profile is updated according to the number of write operations that occur within four temperature ranges, R1 to R2, R2 to R3, R3 to R4, and R4 to R5. After a number of write operations occur, the write temperature historical profile process is modified to only store the number of write operations that fall within the R1 to R3 range. The previous write temperature historical profile depicted in FIG. 10A may be reconfigured to be consistent with the new update process. For example, the information of the previous historical profile may be merged and some information from the initial historical profile may be deleted. FIG. 10B shows a histogram that represents the write temperature historical profile after reconfiguration. Subsequent updates to the historical profile of the write temperature illustrated in FIG. 10B will occur if the temperature of the write operation falls within the temperature range R1 to R3.

Figure 11A:
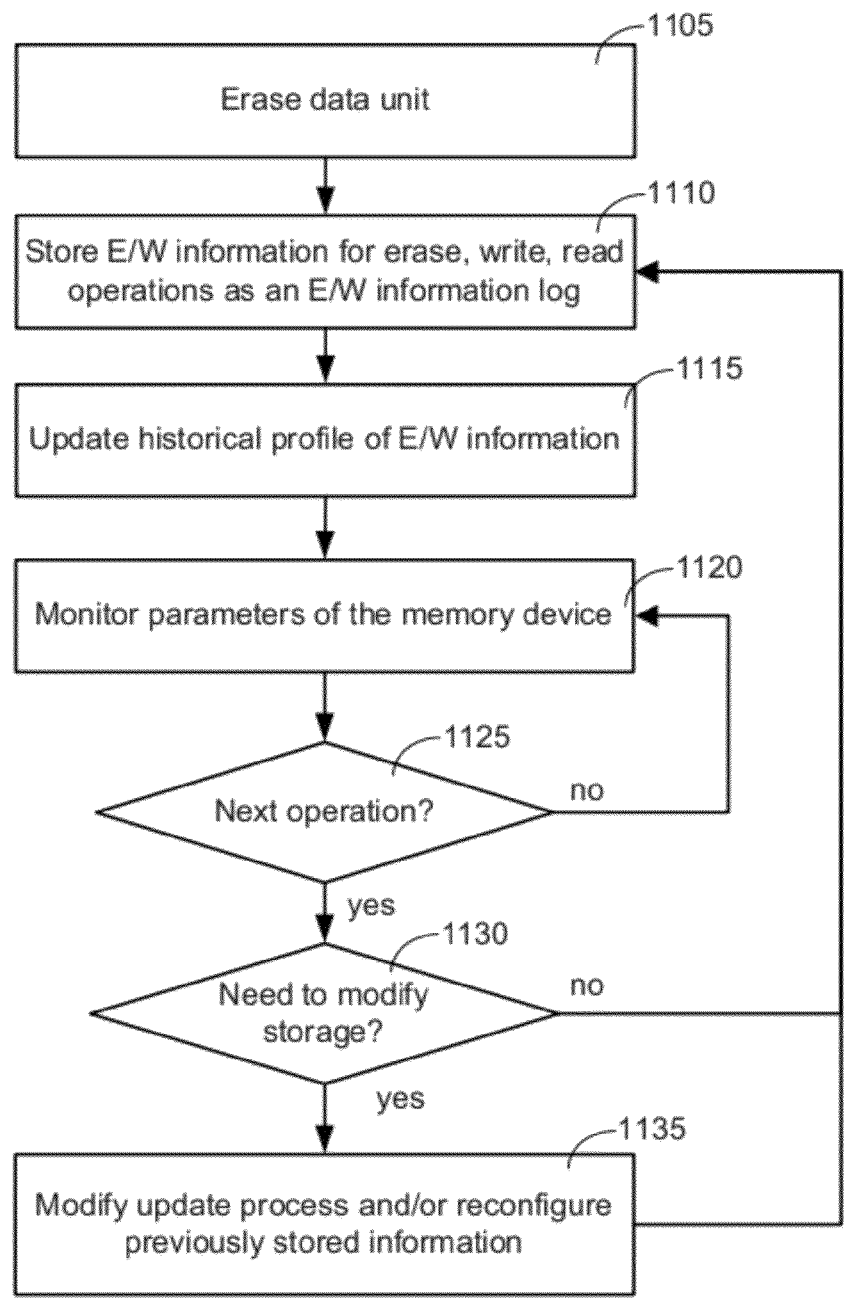
FIG. 11A is a flow diagram that illustrates development of a historical profile for a data unit.
Figure 11B:
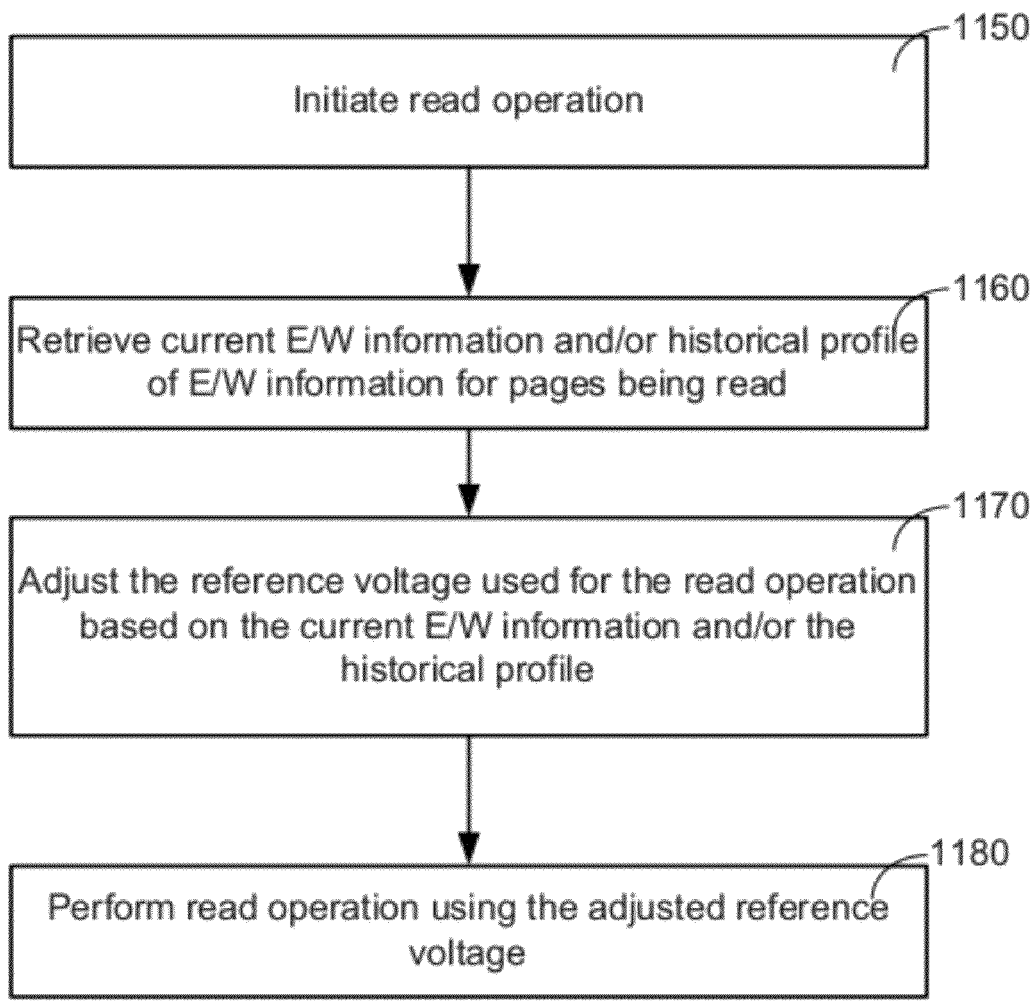
FIG. 11B is a flow diagram of a process for using the historical profile to configure the read channel.

The flow diagrams of FIGS. 11A and 11B illustrate methods for developing the historical profile for a data unit (FIG. 11A) and using the historical profile to configure the read channel (FIG. 11B). In these example methods, optional reconfiguration of the E/W information stored in the historical profile and modifying the historical profile update process are also illustrated. Referring to FIG. 11A, after the data unit is erased 1105, the E/W information for the current erase, write, read operation is stored 1110. The historical profile is updated 1115 using the current E/W information. The parameters of the memory device are monitored 1120 until the next operation, e.g., write operation or read operation, is performed 1125. According to the illustrated method, it is determined whether there is a need 1130 to reconfigure the E/W information and/or modify the E/W update process. For example, reconfiguring the E/W information may involve reconfiguring the E/W information log that includes information from the current erase/write/read cycle operations, and/or reconfiguring the historical profile of the E/W information. Modifying the E/W update process may involve modifying the update process for the E/W information log that includes information from the current erase, write, read cycle operations and/or modifying the update process for the historical profile of the E/W information. Any or all of these actions may be taken to reduce the amount of information stored for the current erase/write/read cycle operations and/or the historical profile of information spanning multiple erase/write/read cycle operations if storage capacity is diminished due to updates from a large number of previous erase/write/read operations. As another example, any or all of these actions may be taken to increase the amount of E/W information stored if the results of previous read operations indicate that more detailed E/W information from the erase/write/read cycle operations and/or a more extensive historical profile is likely to reduce errors in the data read during the read operations.

If there is a need to modify the E/W information update process for the E/W information log and/or the E/W information historical profile and/or to reconfigure the information previously stored as the E/W information log and/or historical profile, then one or more of these actions are taken 1135. Subsequent updates are performed using the modified update process.

The flow diagram of FIG. 11B illustrates a process for using the write operation parameters to configure the read channel. In this example, the read channel is configured by altering one or more of the reference voltages used for the read operation. A read operation for a data unit, or certain pages of the data unit, is initiated 1150. The current E/W information and/or the historical profile of E/W information for the pages being read are retrieved 1160 from the E/W information storage location, e.g., the data unit header. One or more reference voltages used for the read operation are adjusted 1170 using the current E/W information and/or the historical profile. The read operation is performed 1180 using the adjusted reference voltage. For example, one or more read operation reference voltages may be shifted to compensate for expected changes in the threshold voltage of the memory cells due to one or more of the elapsed time from the last write operation, the temperature of the last write operation, the number of erase/write cycles experienced by the pages, the number of cold write operations experienced by the pages, and/or other factors.

The discussion below provides examples of adjusting the reference voltage for read operations of the memory cells. Referring back to FIG. 1B, the memory array 115 may be a single level cell (SLC) or multi-level cell (MLC) memory array. Single level cells are capable of storing one bit of data per memory cell. In SLC devices, a logical one is represented as a first analog threshold voltage and logical zero is represented as a second analog threshold voltage. Multi-level cell (MLC) memory devices are capable of storing multiple bits per memory cell. For example, two, three, or more bits may be stored in an MLC memory cell. Each two, three, or more bit symbol is stored in the MLC memory cell as a distinct analog threshold voltage. Because each memory cell has slightly different characteristics, e.g., random variations of critical dimensions, thickness, and doping, and/or other factors, and the analog threshold voltages representing the digital symbols for the memory cells of a memory array (or a unit of the memory array, such as a page, block, or data unit) have a distribution of threshold voltages.

Figure 12A:
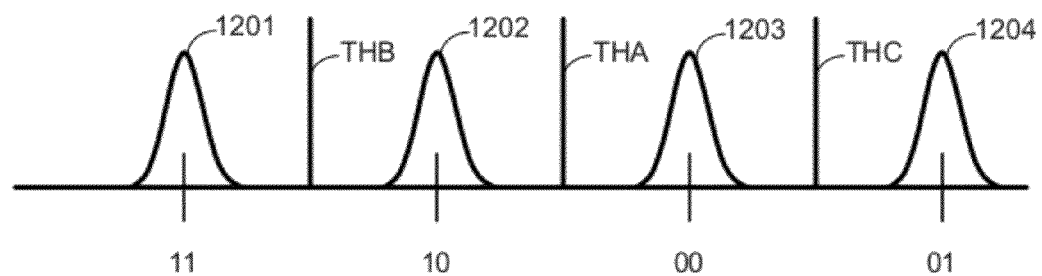
FIG. 12A depicts voltage distributions and reference voltages of a multi level cell (MLC) memory device.

Typical voltage distributions for an MLC memory array capable of storing two bits per memory cell are illustrated in FIG. 12A. In this example, the digital symbol 11 requires the lowest voltage and may represent the erased state. Voltage distribution 1201 is associated with the digital symbol 11, voltage distribution 1202 is associated with digital symbol 10, voltage distribution 1203 is associated with the digital symbol 00, and voltage distribution 1204 is associated with the digital symbol 01. For each digital symbol, the digit on the left is the most significant bit (MSB) and the digit on the right is the least significant bit (LSB).

Figure 12B:
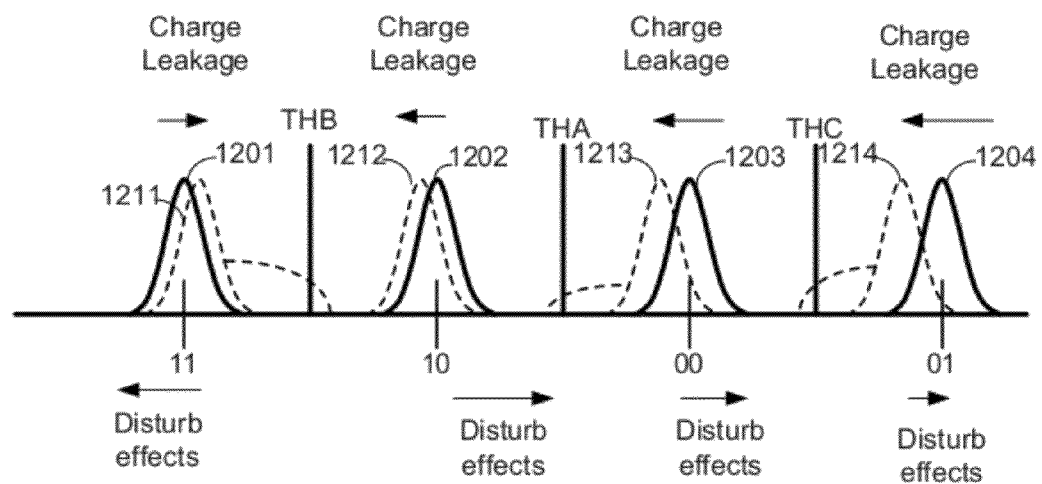
FIG. 12B illustrates the effect of charge leakage and stress induced leakage current on the voltage distributions of FIG. 12A.

Reading the digital state of a memory cell may be accomplished by comparing the sensed voltage levels of the memory cells to one or more reference voltages, represented as THA, THB, THC in FIGS. 12A and 12B. Comparison to a first reference voltage, THA, discriminates the MSB bit of the digital state stored in the memory cell. If the sensed voltage is lower than THA, then the state of the MSB is 1 and if the sensed voltage is greater than THA, then the state of the MSB is 0.

Reading the LSB requires comparison to an additional reference voltage. If the sensed voltage is less than THA, then comparison to reference THB discriminates between an LSB of 1 and an LSB of 0. If the sensed voltage is less than THAB, then the LSB stored in the memory cell is 1. If the sensed voltage is greater than THB, then the LSB stored in the memory cell is 0. If the sensed voltage is greater than THA, then comparison to reference voltage THC discriminates between an LSB of 1 and an LSB of 0. If the sensed voltage is greater than THC, then the LSB is 1. If the sensed voltage is less than THC, then the LSB is 0.

The distances between the edges of the distributions 1201, 1202, 1203, 1204 and the location of the reference voltages THA, THB, THC affect the error rate of the memory cells. If any of the voltage distributions overlap the reference voltages THA, THB, THC, data errors are likely to occur. Thus, it is desirable to maintain acceptable distribution margins between the edges of the distributions and the reference voltages THA, THB, THC.

Erase, write, and read disturbs and/or charge leakage over time, and/or other factors can change the analog threshold voltage of memory cells, causing the voltage distribution of a group or memory cells, e.g. a page, group of pages, or other unit of data, of a memory device to change and to overlap the reference voltages. The susceptibility to change and/or the amount of voltage shift experienced by any particular memory cell may vary from one memory device to another, may vary from one memory cell page to another, may vary from memory cell to memory cell within a memory page, and/or may vary depending on the history of the memory cell. For example, each memory cell page or block of a memory device may have a unique history with regard to erase/write cycles. Susceptibility to charge leakage and/or to disturbs effects typically increases with number of erase/write cycles experienced by the memory cells and/or to the number of erase/write cycles that occur at cold temperatures.

The amount, direction and/or susceptibility of voltage change, e.g., due to retention effects and/or disturb effects, may vary depending on the digital symbol being represented by the analog voltage. For example, a memory cell storing a higher voltage may be more susceptible to charge leakage than memory cells storing lower voltages. Memory cells storing lower voltages may be more susceptible to disturb effects than memory cells storing higher voltages.

FIG. 12B illustrates the shifted voltage distributions 1211, 1212, 1213, 1214 after the initial voltage distributions 1201, 1202, 1203, 1204 are shifted and distorted due to charge leakage and stress induced leakage current (SILC). Charge leakage due to retention time causes the voltage distributions 1202, 1203, 1204 to shift from a higher voltage to a lower voltage as charge leaks from the memory cells. Memory cells storing symbols represented by higher voltages, e.g., symbols 00 and 01 in FIG. 12B, may experience a larger charge leakage shift than symbols represented by lower voltages, e.g., symbols 10 in FIG. 12B. In FIGS. 12A and 12B, digital symbol 11 is represented by a negative voltage and symbols 10, 00, and 01 are represented by positive voltages. Note that the negative voltage distribution 1201 representing the digital symbol 11 exhibits shift which is opposite in direction to the shifts of the positive distributions 1202, 1203, 1204.

FIG. 12B also depicts the direction of change in the distributions due to disturb effects. Disturb effects can operate to shift the voltage of a memory cell in a direction opposite to the voltage shift caused by charge leakage and SILC. Disturb effects tend to add charge to a floating gate, thereby increasing the analog voltage of the memory cell. Smaller analog threshold voltages of a memory cell correspond to a smaller amount of charge stored in the floating gate. A memory cell storing a smaller amount of charge (and having a lower threshold voltage) may be more sensitive to program/read/erase disturbs which add charge to the floating gate. Thus, memory cells storing an analog voltage representing the digital symbol 10 in FIG. 12A may be more sensitive to program/read/erase disturbs than memory cells storing an analog voltage representing the digital symbol 01, for example.

Figure 13A:
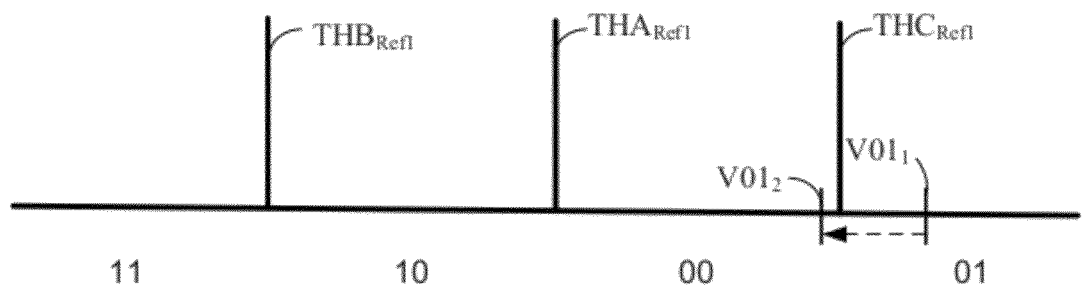
FIG. 13A illustrates a voltage shift due to charge loss from a memory cell.

FIGS. 13A-13D illustrate shifting the reference voltages used for reading the memory cells to compensate for charge leakage and/or disturb effects. The illustrated approaches involve shifting the reference voltage used to read the analog voltages corresponding to the digital symbols 01 and 10, however, the approaches are applicable to any of the reference voltages used to read the threshold voltage of the memory cell. FIG. 13A depicts a scenario wherein an analog voltage, $V01_1$, representing the digital symbol 01, has been programmed into a memory cell. After programming the memory cell, the digital symbol stored in the memory cell can be read by sensing the voltage $V01_1$ and comparing the voltage $V01_1$ to a nominal reference voltage $THC_{Ref1}$. Because $V01_1$ is greater than the nominal reference voltage $THC_{Ref1}$, the digital symbol stored in the memory cell is correctly identified and transferred to the memory controller as 01.

However, due to charge leakage, which is the predominant mechanism for changes in the voltage distribution for this symbol, electrons stored on the floating gate of the memory cell can leak away, causing the threshold voltage of the memory cell to decrease to voltage $V01_2$. If the memory cell is read after the charge leakage, comparison of the analog voltage $V01_2$ to the nominal reference voltage, $THC_{Ref1}$ leads to erroneous identification of the digital symbol stored in the memory cell as 00 rather than 01. This erroneous value is transferred from the memory array to the memory controller, where the decoder circuitry attempts to decode the data. The data may include too many errors to allow convergence.

Figure 13B:
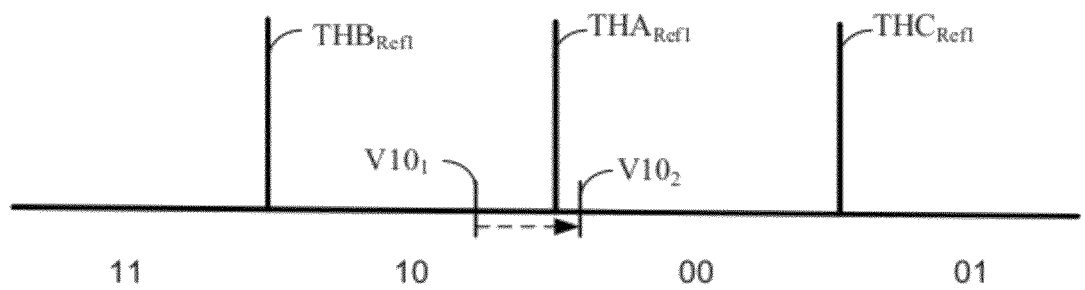
FIG. 13B illustrates a voltage shift due to charge gain of a memory cell.

FIG. 13B illustrates a scenario wherein an analog voltage, $V10_1$, representing the digital symbol 10, has been programmed into a memory cell. After programming the memory cell, the digital symbol stored in the memory cell can be read by sensing the voltage $V10_1$ and comparing the voltage $V10_1$ to a nominal reference voltage $THA_{Ref1}$. Because $V10_1$ is less than the nominal reference voltage $THA_{Ref1}$, the digital symbol stored in the memory cell is correctly identified and transferred to the decoder circuitry in the memory controller as 10. However, the voltage of the memory cell may be disturbed when other memory cells are erased, read and/or programmed causing additional electrons to be stored on the floating gate of the memory cell. The disturb effects result in an increase in the memory cell voltage from voltage $V10_1$ to voltage $V10_2$. If the memory cell is read after the voltage change occurs, comparison of the analog voltage $V10_2$ to the nominal reference voltage, $THA_{Ref1}$ leads to an erroneous interpretation of the digital symbol stored in the memory cell as 00. The decoder circuitry of the memory controller attempts to decode this erroneous data and may be unable to correct for the data errors.

Figure 13C:
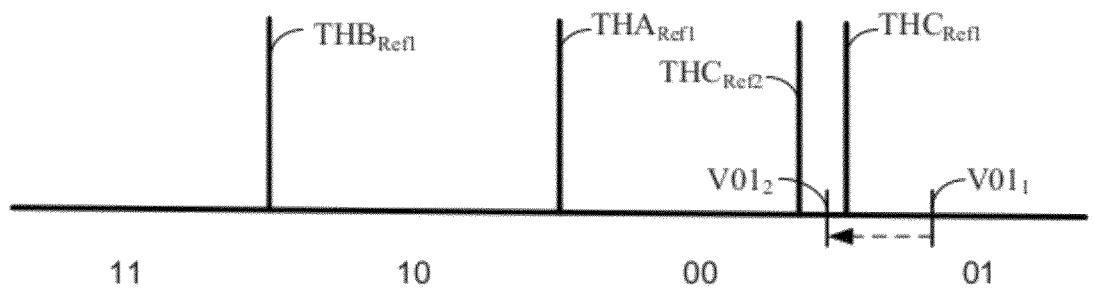
FIG. 13C illustrates a reference voltage shift that compensates for a decrease in memory cell voltage.
Figure 13D:
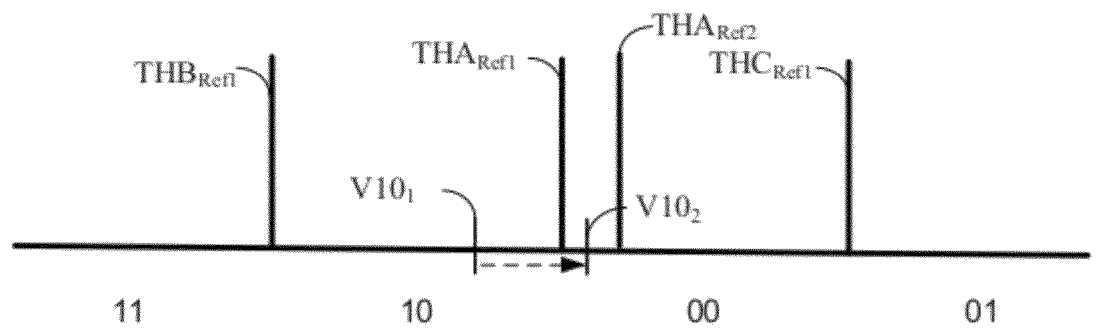
FIG. 13D illustrates a reference voltage shift that compensates for an increase in memory cell voltage.

In the scenarios described in connection with FIGS. 13A and 13B, the voltage change from $V01_1$ to $V01_2$ or $V10_1$ to $V10_2$ may be taken into account and compensated for by shifting the reference voltages used to interpret the threshold voltages. For example, as illustrated in FIG. 13C, lowering the reference voltage from the nominal reference voltage, $THC_{Ref1}$, to a shifted reference voltage, $THC_{Ref2}$, allows the digital symbol represented by $V01_2$ to be correctly interpreted as 01 rather than erroneously interpreted as 00. Comparison of the analog voltage $V01_2$ to shifted reference voltage $THC_{Ref2}$ indicates that $V01_2$ is greater than $THC_{Ref2}$ leading to the correct interpretation of the digital symbol stored in the memory cell as 01. Similarly, increasing the reference voltage from the nominal reference voltage $THA_{Ref1}$ to the shifted reference voltage $THA_{Ref2}$ as depicted in FIG. 13D allows the digital symbol represented by $V10_2$ to be correctly interpreted as 10.

As previously discussed, it can be useful to anticipate and compensate for phenomena that affect the charge stored in the memory cells, such as charge retention leakage and disturb effects. Compensation for these phenomena may involve shifting reference voltages used for read operations of the memory cell. The memory system may use the E/W information from the current erase/write/read cycle of the memory cells being read, e.g., the write times and/or write temperatures of the write operations of the current erase/write cycle, and/or may use a historical profile of the E/W information for the memory cells being read, e.g., the overall number of erase/write cycles and the temperatures of previous write operations and/or may use information about the erase, write, and read cycles of other memory cells, to determine the amount of voltage shift used for the shifted reference voltage.

Referring again to FIG. 1C, the memory controller includes read channel configuration circuitry 128 configured to calculate the amount of voltage shift from the nominal reference voltage based on the stored E/W information. In addition to the E/W information, the read/write channel configuration may take into account additional information, including the physical and material configuration of the memory cells, e.g., dimensions, thickness, and doping, etc., the type of data page stored by the memory cell, e.g., MSB page or LSB page, the history of data errors of the memory cell, the temperature of the memory cell at the time of the read operation, and/or other information.

The E/W information and additional information may be used to predict the amount of shift in the analog threshold voltage of the memory cell. The amount of shift can be predicted based on one or more parameters that cause memory cell charge loss or charge gain. In some cases, the read channel configuration circuitry 128 may calculate the voltage shift as a function of only one of parameter, e.g., the time since the last write operation. In some implementations, the read channel configuration circuitry 128 may calculate the voltage shift as a function of multiple parameters. For example, in some cases, the charge loss/gain parameters used to calculate the reference voltage shift may include, the number of erase/write cycles experienced by a memory cell, the number of cold temperature write operations experienced by the memory cell, the data symbol being stored, and/or the erase, write, and/or read operations performed on certain other memory cells that affect the charge stored in the memory cell being read.

The shift in the voltage of a memory cell, $\Delta_P$, due to charge loss/gain parameters $U_1, U_2, U_3, \ldots U_J$ may be determined using a charge loss/gain model of the memory cell, expressed as $f(U_1, U_2, U_3 \ldots U_J)$, where $U_1, U_2, U_3 \ldots U_J$ are charge loss/gain parameters such as those discussed herein. The amount of change of the threshold voltage of a memory cell due to each factor $U_1, U_2, U_3, \ldots U_J$ may be estimated based on a characterization of a population of similar memory cells before the memory cell is in use, or may be estimated based on a characterization of the memory cell (or other memory cells of the same memory device) during the time that the memory cell is in use. For example, when population data is used, then the shifted reference voltage may be calculated:

$$VRef_{shifted} = VRef_{nominal} + \Delta_P$$

where, $VRef_{nominal}$ is the initial reference voltage, $\Delta_P$ is the expected voltage shift determined using the charge/loss gain model $f(U_1, U_2, U_3, \ldots U_J)$ of the memory cell derived from population data, and $U_1, U_2, U_3, \ldots U_J$ are the charge loss/gain parameters of, e.g., the write times and/or write temperatures and/or other charge loss/gain parameters.

In some implementations, the charge/loss gain model of the memory cells may be developed over time. For example, the charge/loss model of the memory cells may be developed by adjusting the read reference voltages based on the charge loss/gain parameters and determining the success of the read operation using the adjusted reference voltages. With each successive read operation, additional information is obtained about the charge loss/gain behavior of the memory cells and the charge loss/gain model is adapted accordingly. Thus, the memory device develops the charge loss/gain model of the memory cells and continues to adapt the model with each read operation. The shifted reference voltage may then be calculated based on the characterization of the charge/loss model of the memory cells.

For example, when the charge/loss model developed over time using successive read operations is used, the shifted reference voltage may be calculated:

$$VRef_{shifted} = VRef_{nominal} + \Delta_C,$$

where, $VRef_{nominal}$ is the initial reference voltage, $\Delta_C$ is the expected voltage shift determined using the charge loss/gain model, $f(U_1, U_2, U_3, \ldots U_J)$ of the memory cell derived from the adaptive model of the memory cell or memory cell array, and $U_1, U_2, U_3, \ldots U_J$ are the read/write parameters of interest. In some implementations, the charge loss/gain model of the memory cell may be derived using population data for some charge loss/gain parameters and using data acquired from the memory array for other charge loss/gain parameters. In some implementations population data may initially be used to generate the charge loss/charge gain model, but as charge loss/gain data for the memory cell array is acquired, the charge loss/charge gain model may increasingly rely on the charge loss/gain data acquired from the memory cell array.

The approaches described herein involve acquiring information related to phenomena such as charge leakage and/or disturb effects and using the information to configure the read channel to compensate for these phenomena. As previously discussed, the information used to compensate for these charge leakage and disturb effects may include, for example, the time that data was written to the memory cells, the temperature of the write operation, the temperatures of previous write operations, the number of previous erase/write cycles experienced by the memory cells, and the operating temperature of the memory cells, among other factors. The read channel can be configured by shifting the reference voltages to compensate for the changes in the memory cell threshold voltages due to charge leakage and/or disturb effect. Additional information can be acquired and used to configure the read channel. If a reference voltage determined using E/W information does not result in convergence of the read data, the reference voltage may be re-determined and the read operation re-attempted. For multilevel memory cells, each of the reference voltages used to discern the stored data symbols may be individually adjusted.

The result of previous read operations may be collected and used to determine the E/W information acquired. For example, higher read errors may cause the process to implement acquire more extensive E/W information and lower read errors may cause the process to reduce the amount of E/W information acquired. Thresholds and intervals used to update the E/W information stored in the data unit header or elsewhere can be set by an operator and/or can be dynamically determined based on projections of memory usage made by the memory controller. The memory controller can dynamically determine which information is acquired, the intervals and thresholds used to trigger storage and/or other aspects of read channel configuration to achieve a desired error rate.

It is to be understood that even though numerous characteristics of various embodiments have been set forth in the foregoing description, together with details of the structure and function of various embodiments, this detailed description is illustrative only, and changes may be made in detail, especially in matters of structure and arrangements of parts illustrated by the various embodiments to the full extent indicated by the broad general meaning of the terms in which the appended claims are expressed.

What is claimed is:

1. A method of controlling a read operation of a solid state non-volatile memory, comprising:
    performing a write operation involving pages of memory cells of a data unit;
    storing time information of the write operation;
    storing temperature information of the write operation;
    determining one or more reference voltages to be used for reading data stored in the pages of the data unit using one or both of the write time information and the write temperature information; and
    sending an output to the memory that includes information about the reference voltages to be used for reading the data stored in the pages of the data unit.

2. The method of claim 1, wherein storing the write time information and the write temperature information comprises storing the write time information and the write temperature information in a data unit header within the data unit.

3. The method of claim 2, further comprising updating the data unit header with write time information and write temperature information from one or more additional write operations.

4. The method of claim 3, wherein updating the data unit header comprises updating the data unit header only if one or both of a write time and a write temperature of an additional write operation is beyond a predetermined value.

5. The method of claim 3, further comprising modifying an update process used in updating the data unit header to increase or decrease an amount of information stored in the data unit header during the updating.

6. The method of claim 5, further comprising triggering modification of the update process in response to diminished capacity of the data unit header or in response to a need for additional information based on an error rate of the pages.

7. The method of claim 2, further comprising reconfiguring information previously stored in the data unit header, the reconfiguring including one or more of compressing, deleting, and combining the information previously stored in the data unit header.

8. The method of claim 1, wherein the data unit comprises a garbage collection unit and performing the write operation comprises performing the write operation during garbage collection.

9. The method of claim 1, wherein determining the reference voltages comprises compensating for one or both of charge leakage and disturb effects.

10. A method of configuring a read channel of a nonvolatile solid state memory, comprising:
developing a historical profile that spans multiple write operations that write data to memory cells of a data unit, the historical profile including at least a number of erase/write cycles experienced by the data unit and temperature information of the data unit;
storing the historical profile;
determining configuration information using the historical profile, the configuration information used for configuring the read channel for a read operation of the memory cells of the data unit; and
sending an output to the memory, the output including the configuration information.

11. The method of claim 10, wherein the temperature information includes one or both of an operating temperature of the data unit and a number of write operations within a temperature range.

12. The method of claim 10, further comprising storing a log of a current write operation that includes one or both of write time information of the current write operation and write temperature information of the current write operation, wherein determining the configuration information includes one or both of determining reference voltages for the read operation using the write time information and the write temperature information and estimating an extent to which charge leakage has altered a threshold voltage of the memory cells.

13. A memory device, comprising:
a write operation control module configured to generate signals that control write operations of a memory, the write operations causing data to be stored in pages of memory cells of a data unit of the memory;
information acquisition circuitry configured to control acquisition and storage of write time information for each write operation and write temperature information for at least some of the write operations; and
read channel configuration circuitry configured to determine read channel configuration information to be used for read operations performed on the pages of the data unit, the read channel configuration circuitry configured to determine the configuration information using the write time information and the write temperature information, the read channel configuration circuitry further configured to output the configuration information to the memory.

14. The memory device of claim 13, wherein the information acquisition circuitry is further configured to acquire an operating temperature of the data unit and the read channel configuration circuitry is configured to determine the configuration information using the operating temperature.

15. The memory device of claim 13, wherein the information acquisition circuitry is configured to control storage of the write time information and the write temperature information in a data unit header within the data unit.

16. The memory device of claim 13, wherein the data unit comprises a garbage collection unit and the write time information comprises a sequence number of the garbage collection unit.

17. The memory device of claim 13, wherein the read channel configuration circuitry is configured to determine reference voltages that compensate for expected shifts in threshold voltages of the memory cells due to charge leakage according to a charge loss/gain model of the memory cells.

18. The memory device of claim 13, wherein the information acquisition circuitry is configured to develop a historical profile that spans multiple write operations, the historical profile developed based on write time information and write temperature information from at least some of the multiple write operations.

19. The memory device of claim 18, wherein the historical profile includes a number of erase/write cycles experienced by the data unit and a number of write operations performed with a temperature range.

20. The memory device of claim 13, wherein the information acquisition circuitry is configured to adapt a process for storing the write time information and the write temperature information in response to reduced storage capacity for the write time information and the write temperature information.

* * * * *